(12) United States Patent
Huang et al.

(10) Patent No.: US 11,777,010 B2
(45) Date of Patent: Oct. 3, 2023

(54) SEMICONDUCTOR STRUCTURE AND METHOD FOR FORMING THE SAME

(71) Applicant: TAIWAN SEMICONDUCTOR MANUFACTURING COMPANY LTD., Hsinchu (TW)

(72) Inventors: Yen-Chieh Huang, Changhua County (TW); Hai-Ching Chen, Hsinchu (TW); Yu-Ming Lin, Hsinchu (TW); Chung-Te Lin, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/238,925

(22) Filed: Apr. 23, 2021

(65) Prior Publication Data

US 2022/0344488 A1 Oct. 27, 2022

(51) Int. Cl.
*H01L 29/51* (2006.01)
*H01L 29/78* (2006.01)
*H01L 21/28* (2006.01)

(52) U.S. Cl.
CPC ...... *H01L 29/516* (2013.01); *H01L 29/40111* (2019.08); *H01L 29/517* (2013.01); *H01L 29/7831* (2013.01); *H01L 29/78391* (2014.09)

(58) Field of Classification Search
None
See application file for complete search history.

(56) References Cited

U.S. PATENT DOCUMENTS

2006/0128108 A1 6/2006 Kim et al.
2015/0228730 A1 8/2015 Yang et al.
2017/0179253 A1 6/2017 Cha et al.

OTHER PUBLICATIONS

English transtlation of CN 108321197 (Year: 2018).*
Onaya et al., Improvement in ferroelectricity of HfxZr1%xO2 thin films using ZrO2 seed layer, Applied Physics Express 10, Jul. 13, 2017, 081501-1 to 5.
Onaya et al.,Improvement in ferroelectricity of HfxZr1-xO2 thin films using top- and bottom-ZrO2 nucleation layers, APL Mater. 7, Jun. 27, 2019, 061107-1 to 7.
Robertson et al., Band structures and band offsets of high K dielectrics on Si, Applied Surface Science 190, 2002, 2-10.
Hays et al., Energy band offsets of dielectrics on InGaZnO4, Applied Physics Reviews vol. 4, 2017, 021301-1 to 22.
D.C. Hays et al., Valence and conduction band offsets in sputtered HfO2/InGaZnO4 heterostructures, Vacuum 116, Mar. 13, 2015, 60-64.
Hays et al., Effect of deposition conditions and composition on band offsets in atomic layer deposited HfxSi1-xOy on InGaZnO4, J. Vac. Sci. Technol. B 35(1), Jan./Feb. 2017, 011206-1 to 6.

(Continued)

*Primary Examiner* — Xiaoming Liu
(74) *Attorney, Agent, or Firm* — WPAT LAW; Anthony King

(57) ABSTRACT

A semiconductor structure includes a gate stack over a substrate and a blocking layer disposed between the gate stack and the substrate. The gate stack includes an upper electrode, a lower electrode, a ferroelectric layer disposed between the upper electrode and the lower electrode, and a first seed layer disposed between the ferroelectric layer and the lower electrode. The blocking layer includes doped hafnium oxide.

20 Claims, 32 Drawing Sheets

(56) References Cited

OTHER PUBLICATIONS

Cao et al., Effects of Capping Electrode on Ferroelectric Properties of Hf0.5Zr0.5O2 Thin Films, IEEE Electron Device Letters, vol. 39 , Issue: 8, Aug. 2018, 1207 to 1210.
Office Action, Cited References and Search Report dated Mar. 21, 2023 issued by the USPTO for the Child U.S. Appl. No. 17/815,253.

* cited by examiner

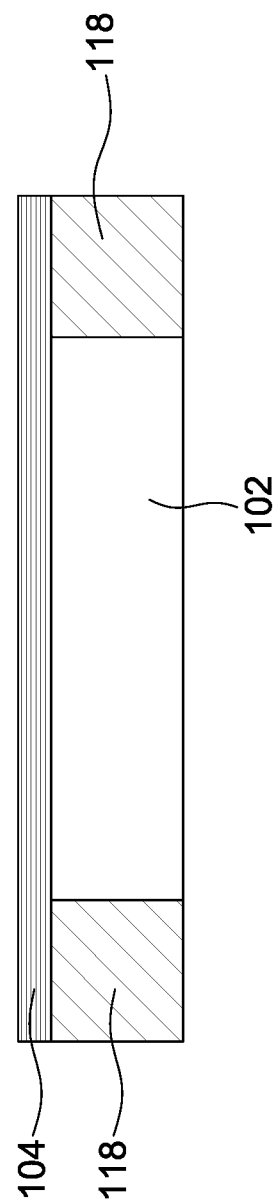

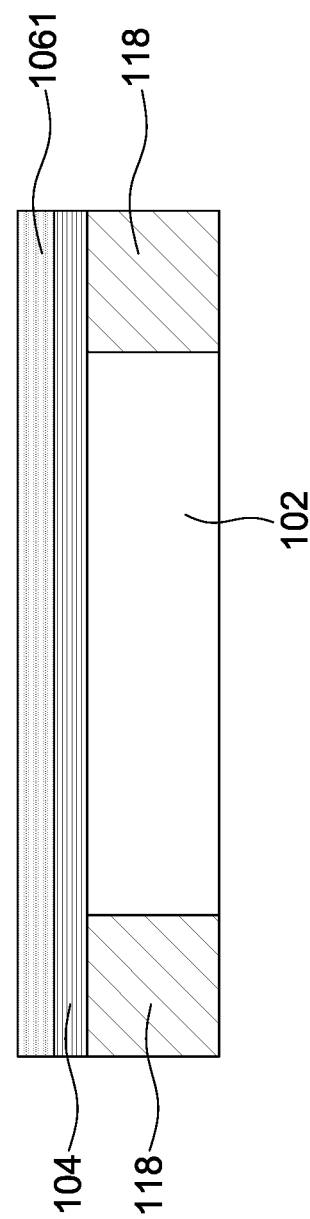

SEMICONDUCTOR STRUCTURE AND METHOD FOR FORMING THE SAME

BACKGROUND

With advantages of non-volatility, low power consumption, short programming time, and high read/write endurance, ferroelectric random-access memory (FeRAM) has drawn increasing attention.

FeRAM can be categorized into two types. One type is made of transistors connected with capacitors, such as 1T1C or chain FeRAM structures. The other type is a field-effect transistor (FET), and is referred to as a ferroelectric memory field-effect transistor (FeMFET). The structure of the FeMFET is similar to that of the metal-oxide-semiconductor field-effect transistor (MOSFET), but the FeMFET uses a ferroelectric material as a part of its gate dielectric.

One type of a FeMFET has an MFS-FET structure in which the gate dielectric is formed using a ferroelectric layer rather than oxide. However, it is found that MFS structures suffer from interface reactions between ferroelectric materials and semiconductor substrates, high leakage current, retention, and fatigue. Another type of FeMFET has a metal-ferroelectric-insulator-silicon-FET (MFIS-FET) structure with an insulating layer separating the ferroelectric layer from the semiconductor substrate. A third type of FeMFET is a metal-ferroelectric-metal-insulator-semiconductor-FET (MFMIS FET) structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A to 6M illustrate schematic cross-sectional views of a semiconductor structure at various stages of fabrication in accordance with some embodiments of the present disclosure.

DETAILED DESCRIPTION

Figure 1:
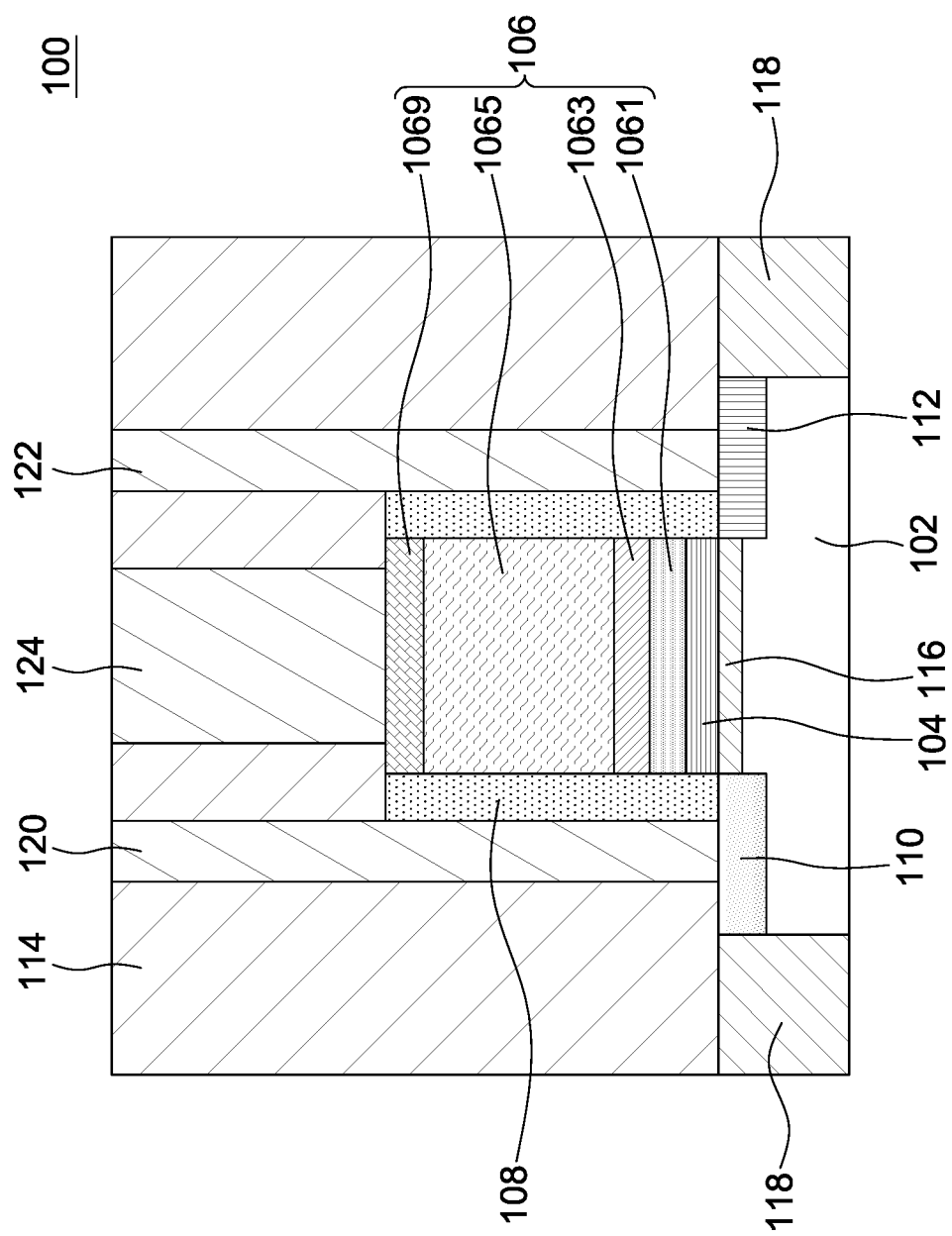
FIG. 1 illustrates a schematic cross-sectional view of a semiconductor structure in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

An MFMIS FET structure may serve as a portion of a transistor with a metal-ferroelectric-metal (MFM) stack serving as a gate structure over an insulator on a semiconductor channel. In some comparative embodiments, the MFMIS FET structure may use single-crystal lead zirconate titanate (PZT) or barium strontium titanate (SBT). The thickness of the PZT or SBT influences performance of the MFMIS FET structure. For example, a thicker ferroelectric layer may result in a greater resistance value and a lower capacitance value. The thickness of the ferroelectric layer also affects multi-domain characteristics of the MFM stack. Therefore, an MFMIS FET structure with a thinner ferroelectric layer is desired. It is desired that the remnant polarization of the ferroelectric layer is promoted and the electron or hole injection from channel to the gate is reduced. It is also desired that the crystallinity of the ferroelectric layer is stabilized.

The present disclosure therefore provides a semiconductor structure and a method for forming the same. In some embodiments, the semiconductor structure may be an MFMIS memory structure. In some embodiments, the semiconductor structure includes a top-gate structure. In some embodiments, the MFMIS memory structure includes a hafnium zirconium oxide (HfZrO)-based ferroelectric layer that may be formed by atomic layer deposition (ALD). Accordingly, a thinner ferroelectric layer is obtained by ALD. Thus, the feasibility of the MFMIS memory structure is further improved.

Refer to FIG. 1. FIG. 1 illustrates a schematic cross-sectional view of a semiconductor structure 100. The semiconductor structure 100 includes a substrate 102, a gate stack 106 over the substrate 102 and a blocking layer 104 between the substrate 102 and the gate stack 106 in accordance with some embodiments of the present disclosure. In some embodiments, the gate stack 106 may include an upper electrode 1069, a lower electrode 1061, a ferroelectric layer 1065, and a first seed layer 1063. In some embodiments, the ferroelectric layer 1065 may be disposed between the upper electrode 1069 and the lower electrode 1061. In some embodiments, the first seed layer 1063 may be disposed between the ferroelectric layer 1065 and the lower electrode 1061.

In some embodiments, the substrate 102 may include a semiconductor material. In some embodiments, the semiconductor material may include silicon. Alternatively, the substrate 102 may include other elementary semiconductor such as germanium (Ge) in accordance with some embodiments of the present disclosure. In some embodiments, the substrate 102 may additionally or alternatively include a compound semiconductor such as silicon carbide (SiC), silicon oxide, gallium arsenide (GaAs), indium arsenide (InAs), indium phosphide (InP), or a combination thereof. In some embodiments, the substrate 102 may include an alloy semiconductor such as silicon germanium (SiGe), silicon germanium carbide (SiGeC), gallium arsenic phosphide (GaAsP), and gallium indium phosphide (GaInP).

In some embodiments, the substrate 102 may be a silicon-on-insulator (SOI) substrate. Generally, an SOI substrate includes a layer of a semiconductor material (e.g., silicon, germanium and/or the like) formed on an insulator layer. In some embodiments, the insulator layer may be, for example, a buried oxide (BOX) layer or a silicon oxide layer. In some embodiments, other substrates that may be used include multi-layered substrates, gradient substrates, hybrid orientation substrates, any combinations thereof and/or the like.

In some embodiments, the blocking layer 104 may be disposed between the gate stack 106 and the substrate 102. In some embodiments, the blocking layer 104 may include doped hafnium oxide. In some embodiments, the blocking layer 104 including doped hafnium oxide may reduce electron or hole injection from a channel region 116 to the gate stack 106. In some embodiments, the doped hafnium oxide may include Si, Mg, Al, $Y_2O_3$, La, Sr, Gd, N, Sc, Ca or a combination thereof. In some embodiments, the doped hafnium oxide may include Si. In some embodiments, the doped hafnium oxide may include Si in a proportion of from approximately 1% to approximately 90%. In some embodiments, the doped hafnium oxide may include Si in a proportion of from approximately 20% to approximately 60%. In some embodiments, the blocking layer 104 has a thickness of from approximately 0.1 nanometers to approximately 10 nanometers.

In some embodiments, the upper electrode 1069 and/or the lower electrode 1061 may be formed with tensile stress. In some embodiments, the upper electrode 1069 and/or the lower electrode 1061 with tensile stress may stabilize the ferroelectric layer 1065. In some embodiments, the upper electrode 1069 and/or the lower electrode 1061 with tensile stress may stabilize the o-phase of the ferroelectric layer 1065. In some embodiments, the upper electrode 1069 and the lower electrode 1061 may include a conductive material. In some embodiments, the conductive material may have a coefficient of thermal expansion (CTE) smaller than that of the ferroelectric layer 1065. For example, the upper electrode 1069 and the lower electrode 1061 may include a conductive material having a coefficient thermal expansion (CTE) less than that of o-phase ferroelectric layer 1065. In some embodiments, the upper electrode 1069 and/or the lower electrode 1061 may include a metal, a metal nitride, a metal alloy or a combination thereof. In some embodiments, the upper electrode 1069 and/or the lower electrode 1061 may include platinum (Pt), titanium (Ti), titanium nitride (TiN), tantalum (Ta), tantalum nitride (TaN), tungsten (W), iron (Fe), nickel (Ni), beryllium (Be), chromium (Cr), cobalt (Co), antimony (Sb), iridium (Ir), molybdenum (Mo), osmium (Os), thorium (1h), vanadium (V), an alloy thereof, or a combination thereof. In some embodiments, the upper electrode 1069 and/or the lower electrode 1061 may have a thickness of from approximately 15 nanometers to approximately 500 nanometers. In some embodiments, the lower electrode 1061 and/or the upper electrode 1069 may be annealed by a post metal anneal (PMA) in an ambient air of nitrogen, argon, oxygen or a combination thereof. In some embodiments, the upper electrode 1069 and the lower electrode 1061 may include the same conductive material. In some alternative embodiments, the upper electrode 1069 and the lower electrode 1061 may include different conductive materials.

In some embodiments, the first seed layer 1063 may be formed in a single-layer form or a multi-layered form. In some embodiments, the first seed layer 1063 may include a metal oxide. In some embodiments, the first seed layer 1063 may include zirconium oxide of cubic-phase (c-phase), tetragonal phase (t-phase) or orthorhombic phase (o-phase), zirconium yttrium oxide of c-phase, t-phase or o-phase, hafnium oxide of c-phase, t-phase or o-phase, aluminum oxide of c-phase, t-phase or o-phase, and hafnium zirconium oxide of c-phase, t-phase or o-phase. For example, the first seed layer 1063 may include c-phase, t-phase or o-phase zirconium dioxide ($ZrO_2$), c-phase, t-phase or o-phase zirconium dioxide and diyttuim trioxide ($ZrO_2$—$Y_2O_3$), c-phase, t-phase or o-phase hafnium dioxide ($HfO_2$), c-phase, t-phase or o-phase dialuminum trioxide ($Al_2O_3$), c-phase, t-phase or o-phase hafnium zirconium oxide ($Hf_xZr_{1-x}O_2$), or a combination thereof, wherein x of $Hf_xZr_{1-x}O_2$ can be varied from 0 to 1. In some embodiments, the first seed layer 1063 may have a thickness of from approximately 0.1 nanometer to approximately 5 nanometers. In the case where the first seed layer 1063 has a thickness less than 0.1 nanometer, the first seed layer 1063 may not be crystallized. However, if the first seed layer 1063 has a thickness more than 0.5 nanometers, the first seed layer 1063 may have a monoclinic phase, which is undesired. In some embodiments, the first seed layer 1063 may promote the remnant polarization (2Pr, wherein 2Pr=$Pr^+$–$Pr^-$) of the ferroelectric layer 1065. In some embodiments, the first seed layer 1063 may be annealed. In some embodiments, the first seed layer 1063 may be annealed by an in-situ annealing process. In some embodiments, after the annealing process, the first seed layer 1063 may have increased crystallinity.

In some embodiments, the ferroelectric layer 1065 has a thickness of from approximately 0.1 nanometer to approximately 100 nanometers. In some embodiments, the ferroelectric layer 1065 includes hafnium zirconium oxide $Hf_xZr_{1-x}O_2$, where x may be any value between 0 and 1. In some embodiments, the ferroelectric layer 1065 may include one or more oxygen vacancies. In some embodiments, the ferroelectric layer 1065 may include $Hf_xZr_{1-x}O_2$ of cubic-phase (c-phase), tetragonal phase (t-phase), orthorhombic phase (o-phase), monoclinic phase (m-phase), or a combination thereof. In some embodiments, the ferroelectric layer 1065 may include aluminum nitride (AlN) doped with Sc or other ferroelectricity elements. In some embodiments, the ferroelectric layer 1065 may include $Hf_xZr_{1-x}O_2$ being doped with silicon (Si), Al, or ions of larger radius, such as lanthanum (La), scandium (Sc), calcium (Ca), barium (Ba), gadolinium (Gd), strontium (Sr), or yttrium to increase remnant polarization (2Pr, wherein 2Pr=$Pr^+$–$Pr^-$). In some embodiments, the ferroelectric layer 1065 may include may include c-phase, t-phase, o-phase, and m-phase $Hf_{0.5}Zr_{0.5}O_2$, with the c-, t-, o-phase $Hf_{0.5}Zr_{0.5}O_2$ being greater than 50% compared to m-phase $Hf_{0.5}Zr_{0.5}O_2$, but the disclosure is not limited thereto.

In some embodiments, the semiconductor structure 100 may further include a spacer layer 108. In some embodiments, the spacer layer 108 may be disposed on sidewalls of the gate stack 106 and the blocking layer 104. In some embodiments, the spacer layer 108 may include a silicon-containing material, such as silicon oxide, silicon nitride or a combination thereof. In some embodiments, the spacer layer 108 may include $Si_3N_4$, $SiO_2$, or a combination thereof.

In some embodiments, the semiconductor structure 100 may further include an interlayer dielectric (ILD) layer 114. In some embodiments, the interlayer dielectric layer 114 may be disposed over the substrate 102 and the gate stack 106. In some embodiments, the interlayer dielectric layer 114 may be patterned to define dimensions and locations for a source region contact 120 which may be in contact with a source region 110, a drain region contact 122 which may be in contact with a drain region 112, and a gate region contact 124 which may be in contact with a top surface of the gate stack 106. In some embodiments, the source region contact 120, drain region contact 122 and gate region contact 124 may include a conductive material. In some embodiments, the conductive material may include a metal, a metal nitride, a metal alloy or a combination thereof.

In some embodiments, the gate stack 106 of the semiconductor structure 100 may further include a second blocking layer (not shown). In some embodiments, the second blocking layer may be disposed between the first seed layer 1063 and the upper electrode 1069. In some embodiments, the second blocking layer may be disposed between the first seed layer 1063 and the ferroelectric layer 1065. In some embodiments, the second blocking layer may be disposed between the ferroelectric layer 1065 and the upper electrode 1069. In some embodiments, the second blocking layer may include a doped metal oxide, such as doped $Ta_2O_5$ or doped $HfO_2$. In some embodiments, the doped $Ta_2O$ or doped $HfO_2$ may include Si, Mg, Al $Y_2O_3$, La, Sr, Gd, N, Sc, Ca or a combination thereof. In some embodiments, the second blocking layer may have a thickness of from 0.1 nanometer to 1 nanometer.

In some embodiments, the semiconductor structure 100 may be electrically separated from other semiconductor structures by an isolation structure 118. The isolation structure may include a shallow trench isolation (STI), but the disclosure is not limited thereto.

Figure 2:
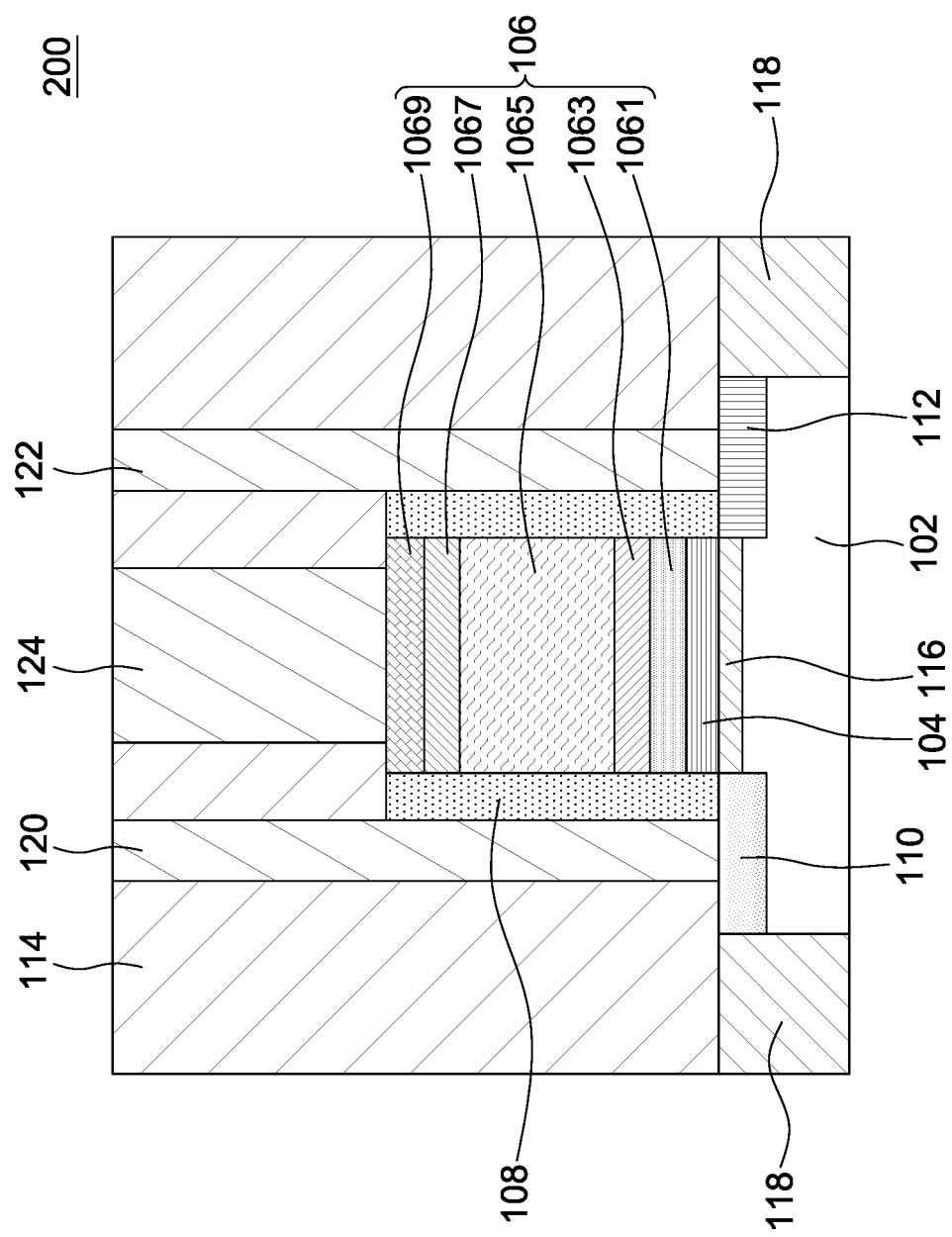
FIG. 2 illustrates a schematic cross-sectional view of a semiconductor structure in accordance with some embodiments of the present disclosure.

Refer to FIG. 2. FIG. 2 illustrates a schematic cross-sectional view of a semiconductor structure 200 including a gate stack 106 over a substrate 102 and a blocking layer 104 in accordance with some embodiments of the present disclosure. In some embodiments, compared to the semiconductor structure 100 as shown in FIG. 1, the gate stack 106 of the semiconductor structure 200 may further include a second seed layer 1067. In some embodiments, the second seed layer 1067 may be disposed between the ferroelectric layer 1065 and the upper electrode 1069. In some embodiments, the second seed layer 1067 may include a metal oxide. In some embodiments, the second seed layer 1067 may include zirconium oxide of cubic-phase (c-phase), tetragonal phase (t-phase) or orthorhombic phase (o-phase), zirconium yttrium oxide of c-phase, t-phase or o-phase, hafnium oxide of c-phase, t-phase or o-phase, aluminum oxide of c-phase, t-phase or o-phase, and hafnium zirconium oxide of c-phase, t-phase or o-phase. For example, the second seed layer 1067 may include c-phase, t-phase or o-phase zirconium dioxide ($ZrO_2$), c-phase, t-phase or o-phase zirconium dioxide and diyttuim trioxide ($ZrO_2$—$Y_2O_3$), c-phase, t-phase or o-phase hafnium dioxide ($HfO_2$), c-phase, t-phase or o-phase dialuminum trioxide ($Al_2O_3$), c-phase, t-phase or o-phase hafnium zirconium oxide ($Hf_xZr_{1-x}O_y$), or a combination thereof, wherein x of $Hf_xZr_{1-x}O_y$ can be varied from 0 to 1. In some embodiments, the second seed layer 1067 may have a thickness of from approximately 0.1 nanometer to approximately 5 nanometers. In the case where the second seed layer 1067 has a thickness less than 0.1 nanometer, the second seed layer 1067 may not be crystallized. However, if the second seed layer 1067 has a thickness more than 0.5 nanometers, the second seed layer 1067 may have a monoclinic phase, which is undesired.

In some embodiments, the gate stack 106 of the semiconductor structure 200 may further include a second blocking layer (not shown). In some embodiments, the second blocking layer may be disposed between the first seed layer 1063 and the second seed layer 1067. In some embodiments, the second blocking layer may be disposed between the first seed layer 1063 and the ferroelectric layer 1065. In some embodiments, the second blocking layer may be disposed between the ferroelectric layer 1065 and the second seed layer 1067. In some embodiments, the second blocking layer may include a doped metal oxide, such as doped tantalum oxide ($Ta_2O_5$), a doped hafnium oxide ($HfO_2$), or a combination thereof. In some embodiments, the doped $Ta_2O_5$ or doped $HfO_2$ may include Si, Mg, Al $Y_2O_3$, La, Sr, Gd, N, Sc, Ca or a combination thereof. In some embodiments, the second blocking layer may have a thickness of from approximately 0.1 nanometer to approximately 1 nanometer.

Figure 3:
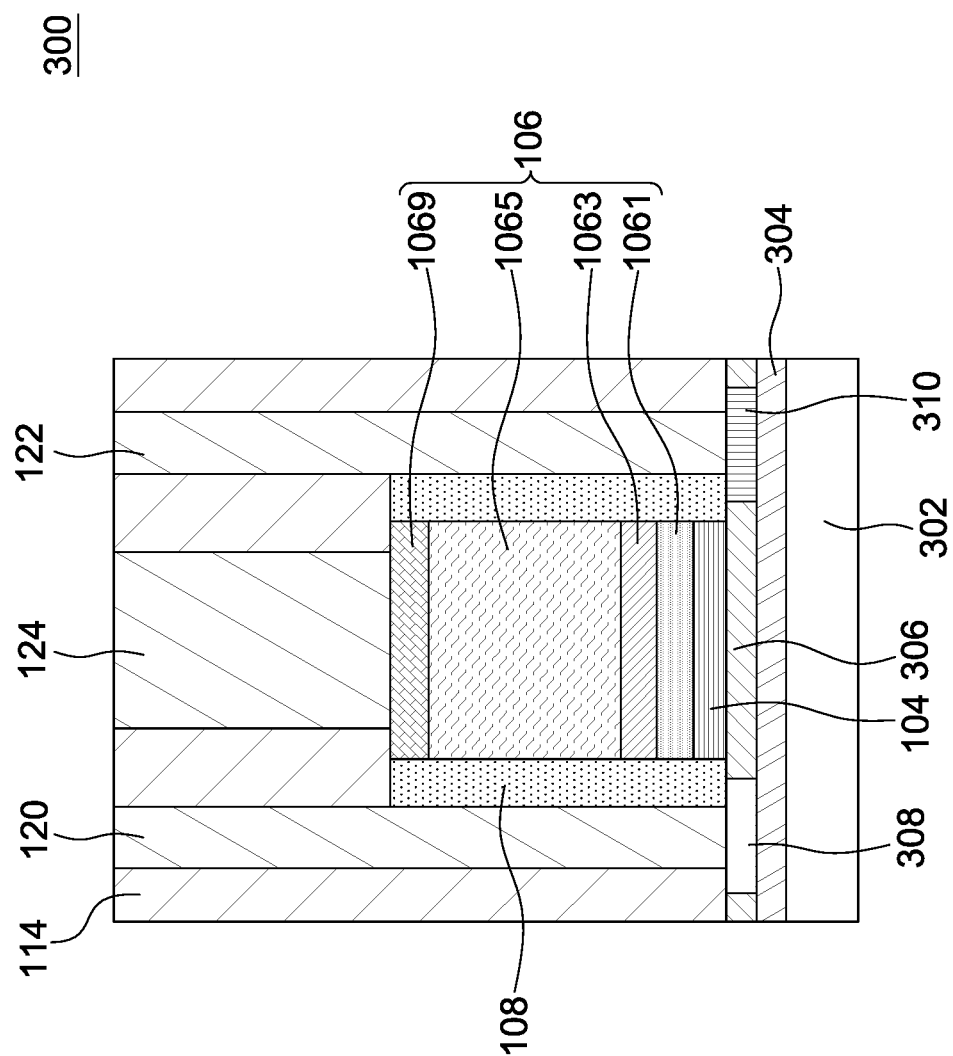
FIG. 3 illustrates a schematic cross-sectional view of a semiconductor structure in accordance with some embodiments of the present disclosure.

Refer to FIG. 3. FIG. 3 illustrates a schematic cross-sectional view of a semiconductor structure 300. In some embodiments, the semiconductor structure 300 may include a substrate 302, a buffer layer 304 over the substrate 302, a channel layer 306 over the buffer layer 304, a gate stack 106 over channel layer 306, and a blocking layer 104 between the gate stack 106 and the channel layer 306 in accordance with some embodiments of the present disclosure. In some embodiments, the gate stack 106 and the blocking layer 104 of the semiconductor structure 300 may be defined in accordance with those described above for the semiconductor structure 100. In some embodiments, the substrate 302 may include a metal oxide semiconductor, such as indium gallium zinc oxide (IGZO). In some embodiments, the IGZO may be amorphous IGZO (α-IGZO).

In some embodiments, the buffer layer 304 may be disposed between the substrate 302 and the channel layer 306. In some embodiments, the buffer layer 304 may include a metal oxide, such as $HfO_x$, $ZrO_x$, $SiO_x$, $AlO_x$, MgO or combinations thereof. A thickness of the buffer layer 304 may be between approximately 0.1 nanometers and approximately 1 nanometer, but the disclosure is not limited thereto. In some embodiments, the buffer layer 304 may provide a better adhesion for the channel layer 306 and the substrate 302. In some embodiments, the buffer layer may reduce the electron or hole injection from the channel layer 306 to the substrate 302.

In some embodiments, the channel layer 306 may include Si, Ge, SiGe, a-IGZO, IZO, SnIGZO, GaN, AlInAs, GaAs or combinations thereof. A thickness of the channel layer 306 may be between approximately 1 nanometer and approximately 150 nanometers, but the disclosure is not limited thereto. The channel layer 306 is of the function of current generation. In some embodiments, the semiconductor structure may further include a source region 308 and a drain region 310. In some embodiments, the source region 308 and the drain region 310 may be disposed over the substrate 302. In some embodiments, the source region 305 and the drain region 310 may be disposed within the channel layer 306.

In some embodiments, the gate stack 106 of the semiconductor structure 300 may further include a second blocking layer (not shown) as defined above with respect to FIG. 1.

Figure 4:
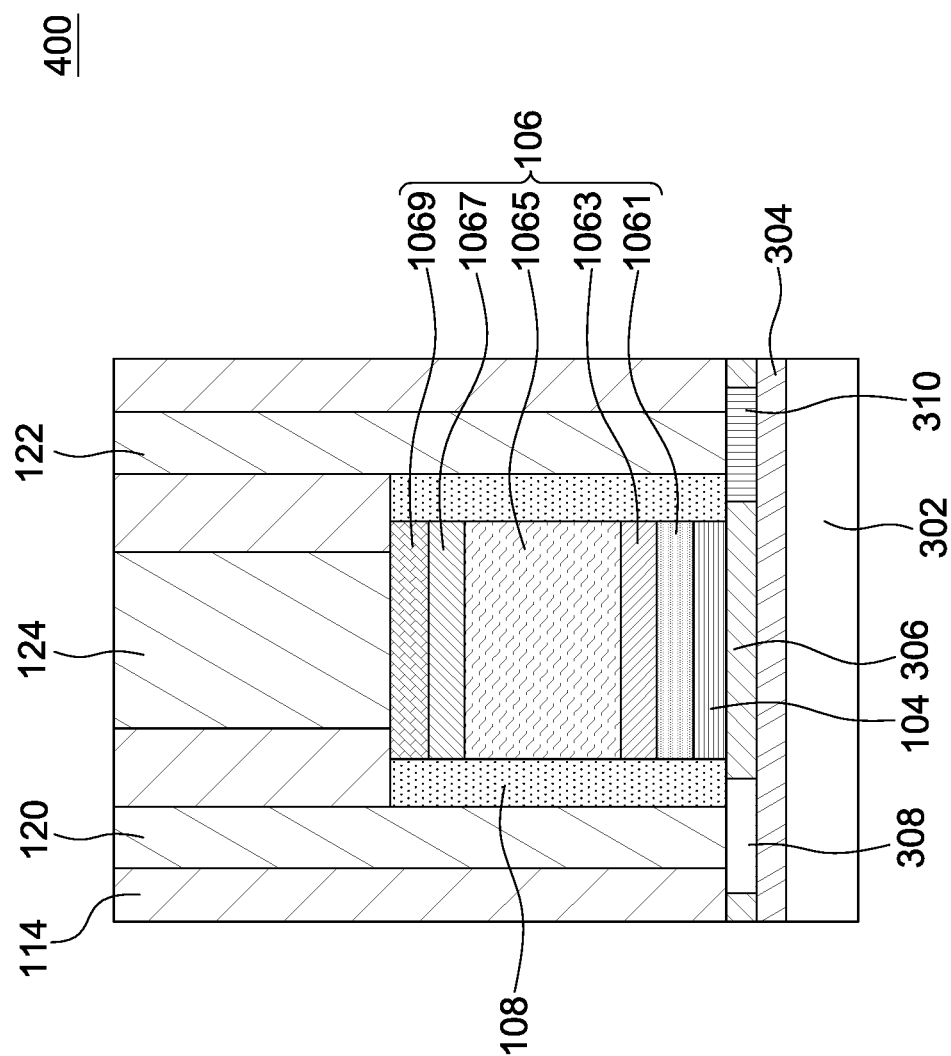
FIG. 4 illustrates a schematic cross-sectional view of a semiconductor structure in accordance with some embodiments of the present disclosure.

Refer to FIG. 4. FIG. 4 illustrates a schematic cross-sectional view of a semiconductor structure 400 including a gate stack 106 over a substrate 302 and a blocking layer 104 in accordance with some embodiments of the present disclosure. In some embodiments, compared to the semiconductor structure 300 as shown in FIG. 3, the gate stack 106 of the semiconductor structure 400 may further include a second seed layer 1067. In some embodiments, the second seed layer 1067 may be defined as described above with respect to the semiconductor structure 200 shown in FIG. 2.

In some embodiments, the semiconductor structure 400 may further include a second blocking layer (not shown) as defined above with respect to FIG. 2.

Figure 5:
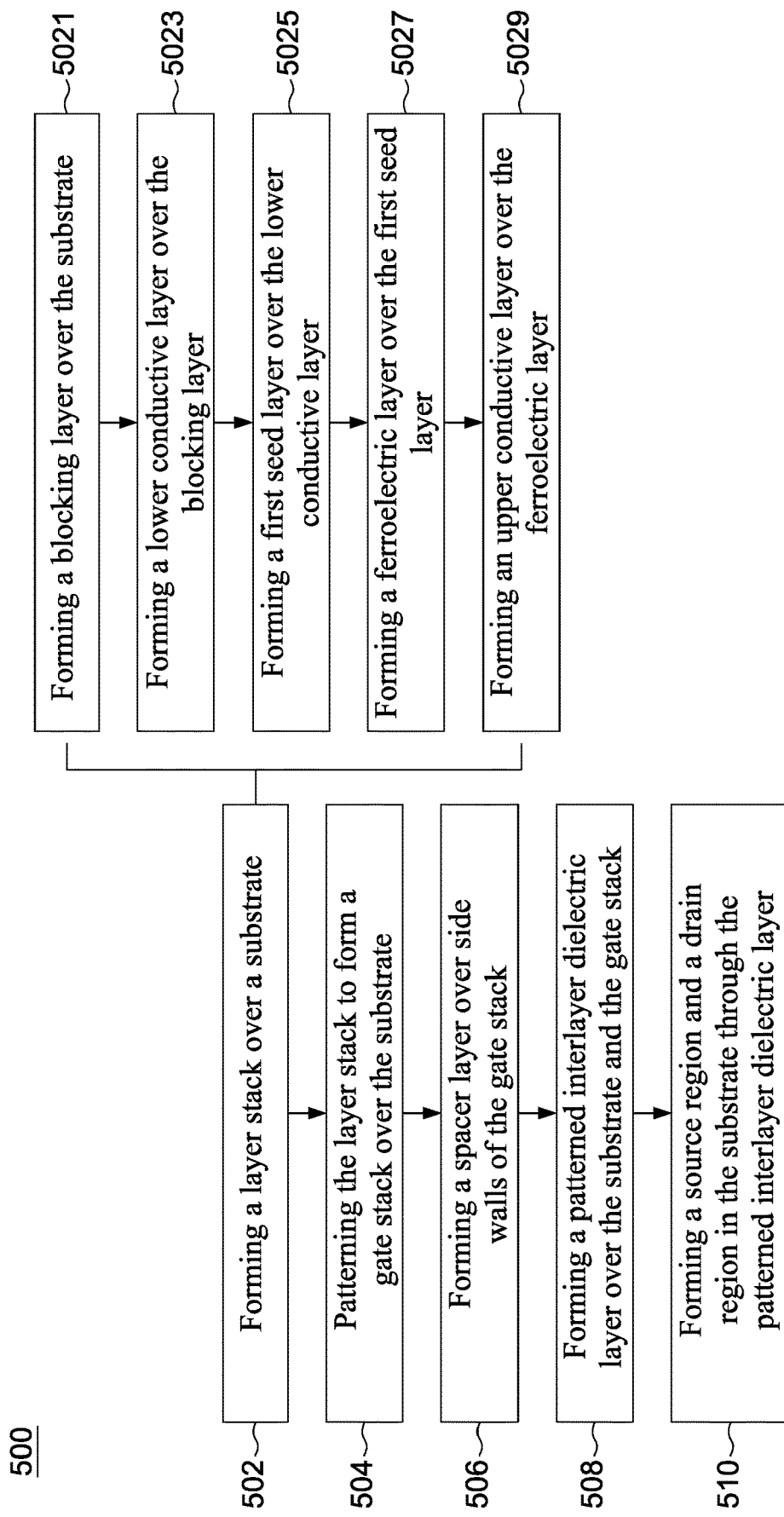
FIG. 5 illustrates a flowchart of a method for forming a semiconductor structure in accordance with some embodiments of the present disclosure.

Refer to FIG. 5. FIG. 5 illustrates a flowchart of a method for forming a semiconductor structure 500 according to aspects of the present disclosure. The method 500 includes a number of operations and will be further described according to one or more embodiments. It should be noted that the operations of the method 500 may be rearranged or otherwise modified within the scope of the various aspects. It should be further noted that additional processes may be provided before, during, and after the method 500, and that some other processes may just be briefly described herein. Thus, other implementations are possible within the scope of the various aspects described herein.

The method 500 begins with operation 502 in which a layer stack in formed over a substrate 102. In some embodiments, at least an isolation structure 118 may be formed in the substrate 102. The isolation structure 118 is formed in the substrate 102 for defining a dimension and a location of a MFMIS structure. Referring to FIG. 6A, in some embodiments, the operation 502 of the method 500 may begin with operation 5021 in which a blocking layer 104 is formed over the substrate 102. In some embodiments, the blocking layer 104 may be formed using chemical vapor deposition (CVD), physical vapor deposition (PVD) or atomic layer deposition (ALD). In some embodiments, the blocking layer 104 may be formed by ALD.

Referring to FIG. 6B, in some embodiments, the operation 502 of the method 500 proceeds with operation 5023, in which a lower conductive layer 1061 is formed over the blocking layer 104. In some embodiments, the lower conductive layer 1061 may be formed using CVD, PVD or ALD, but the disclosure is not limited thereto. In some embodiments, the lower conductive layer 1061 may be annealed. In some embodiments, the lower conductive layer 1061 is annealed by post metal annealing (PMA). In some embodiments, the lower conductive layer 1061 is annealed by PMA at a temperature of from 400° C. to 900° C. In some embodiments, the lower conductive layer 1061 may be annealed by PMA in an ambient air of nitrogen, argon, oxygen or a combination thereof.

Figure 6C:
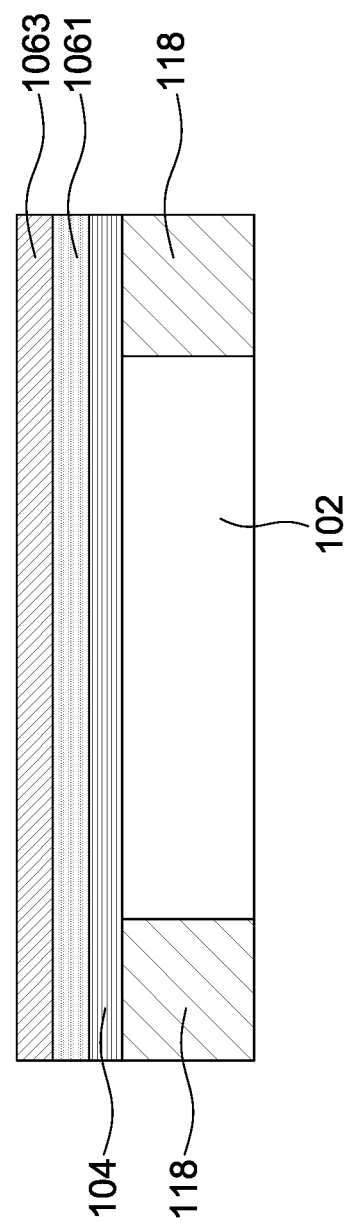

Referring to FIG. 6C, in some embodiments, the operation 502 of the method 500 proceeds with operation 5025, in which a first seed layer 1063 is formed over the lower conductive layer 1061. In some embodiments, the first seed layer 1063 may be formed in a single-layer form or a multi-layered form. In some embodiments, the first seed layer 1063 may be formed using CVD, PVD or ALD. In some embodiments, the first seed layer 1063 may be formed by ALD. In some embodiments, the first seed layer 1063 may be annealed prior to the formation of any further layer(s). In some embodiments, the first seed layer 1063 may be annealed by an in-situ annealing process. In some embodiments, after the annealing process, the first seed layer 1063 may have increased crystallinity.

Figure 6D:
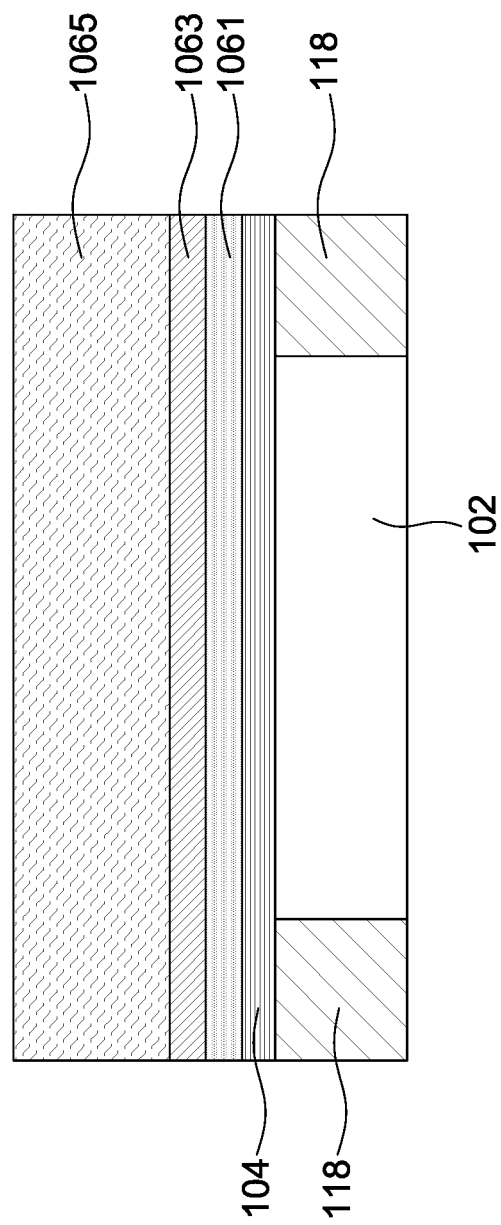

Referring to FIG. 6D, in some embodiments, the operation 502 of the method 500 proceeds with operation 5027, in which a ferroelectric layer 1065 is formed over the first seed layer 1063. In some embodiments, the ferroelectric layer 1065 may be formed using sputtering, chemical solution deposition (CSD), pulsed laser deposition (PLD), CVD, PVD or ALD. In some embodiments, the ferroelectric layer 1065 is formed by ALD to achieve a thinner thickness, such as from approximately 0.1 nanometer to approximately 100 nanometers.

Figure 6E:
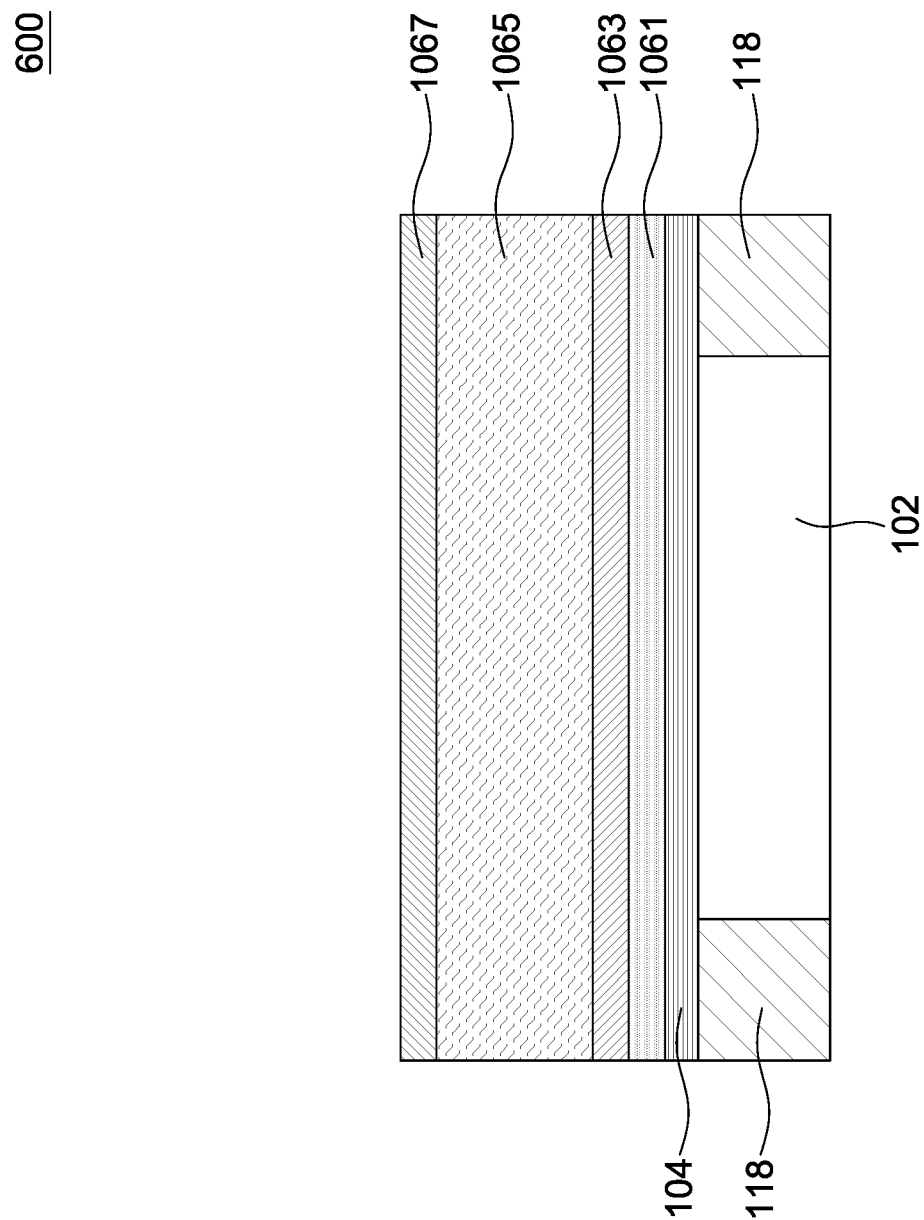

Referring to FIG. 6E, in some embodiments, after operation 5027, a second seed layer 1067 may be formed over the ferroelectric layer 1065. In some embodiments, the second seed layer 1067 may be formed in a single-layer form or a multi-layered form. In some embodiments, the second seed layer 1067 may be formed using CVD, PVD or ALD. In some embodiments, second seed layer 1067 is formed by ALD.

Figure 6F:
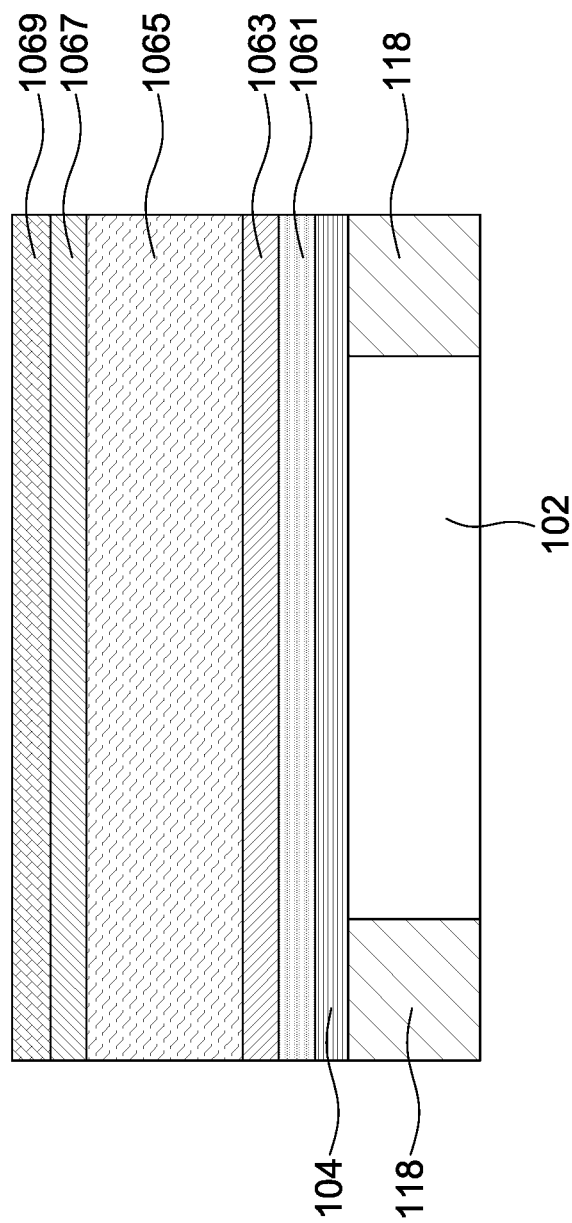

Referring to FIG. 6F, in some embodiments, the operation 502 of the method 100 proceeds with operation 5029, in which an upper conductive layer 1069 is formed over the ferroelectric layer 1065. In some embodiments, the upper conductive layer 1069 may be formed by using CVD, PVD or ALD, but the disclosure is not limited thereto. In some embodiments, the upper conductive layer 1069 may be annealed. In some embodiments, the upper conductive layer 1069 may be annealed by post metal annealing (PMA). In some embodiments, the upper conductive layer 1069 may be annealed by PMA at a temperature of from 400° C. to 900° C. In some embodiments, the upper conductive layer 1069 may be annealed by PMA in an ambient air of nitrogen, argon, oxygen or a combination thereof. In some embodiments, the upper conductive layer 1069 and the lower conductive layer 1061 may be annealed to have tensile stress, and thus may increase the crystallinity of the ferroelectric layer 1065. In some embodiments, the upper conductive layer 1069 and the lower conductive layer 1061 may include the same conductive material. In some alternative embodiments, the upper conductive layer 1069 and the lower conductive layer 1061 may include different conductive materials.

Figure 6G:
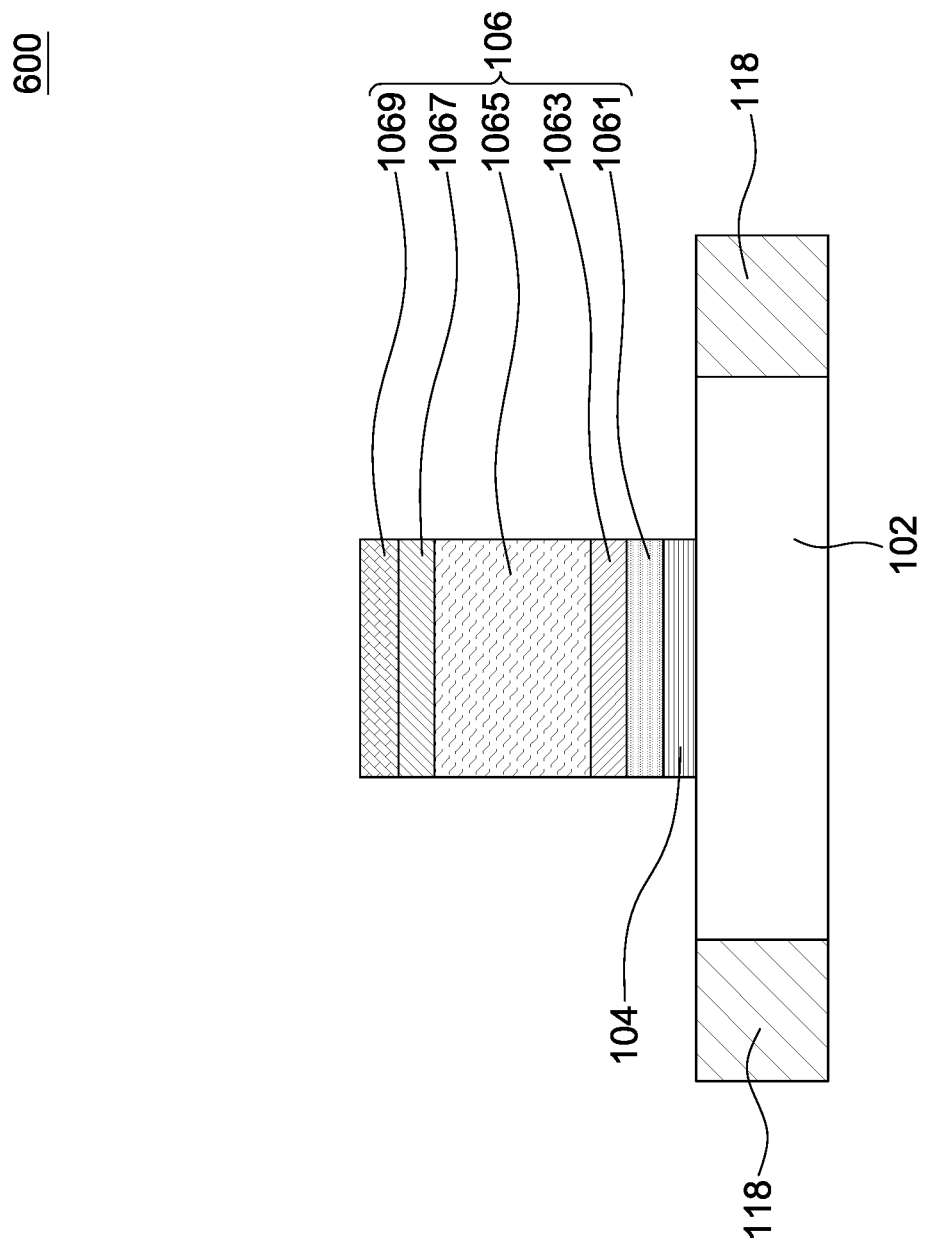

Referring to FIG. 6G, in some embodiments, the method 500 proceeds with operation 504, in which the layer stack is patterned to form a gate stack 106 over the substrate 102. In some embodiments, when the layer stack is patterned, the blocking layer 104 under the gate stack 106 may be patterned as well. In some embodiments, a photolithographic masking process may be performed to the layer stack to define a pattern of the gate stack 106 and the underlying blocking layer 104. In some embodiments, an etching process may be performed to the layer stack to removing a portion of the layer stack to form the gate stack 106 and the underlying blocking layer 104. In some embodiments, the etching process may include a wet etching process and a dry etching process, or a combination thereof. In some embodiments, the isolation structure 118 and portions of the substrate 102 may be exposed through the gate stack 106.

Figure 6H:
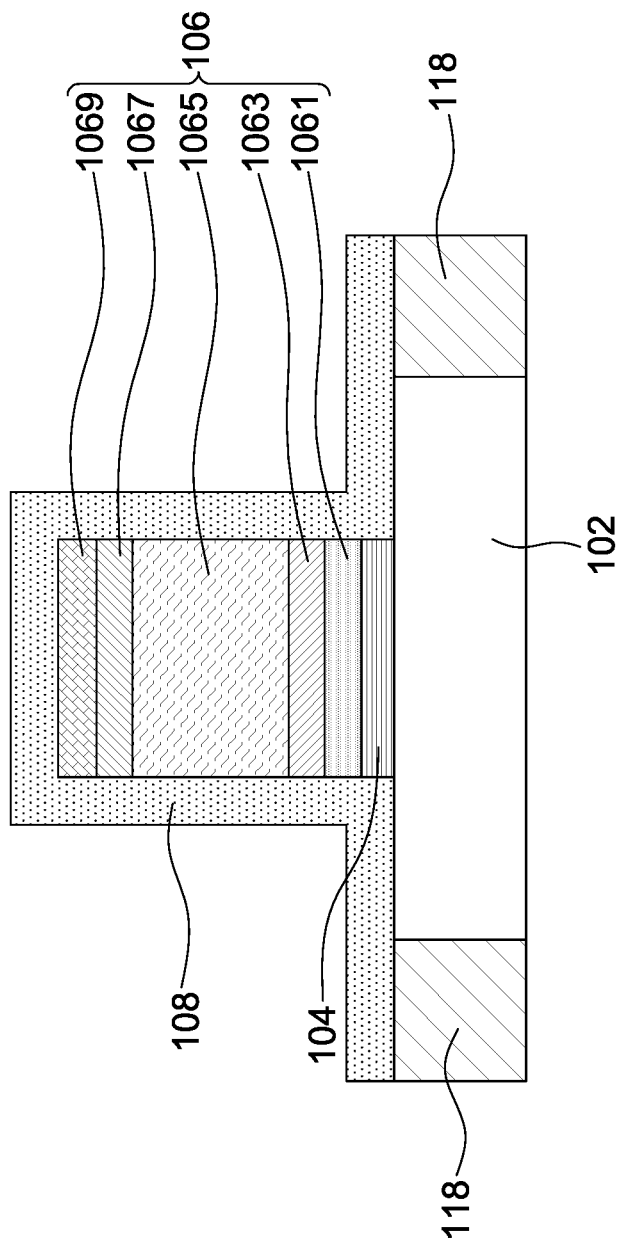

Referring to FIG. 6H, in some embodiments, the method 500 proceeds with operation 506, in which a spacer layer 108 is formed over side walls of the gate stack 106. In some embodiments, the spacer layer 108 may be formed over sidewalls of the blocking layer 104 as well. In some embodiments, the spacer layer 108 may be formed using CVD, PVD or ALD over top surface of the substrate 102, sidewalls of the gate stack 106 and the blocking layer 104, and top surface of the gate stack 106.

Figure 6I:
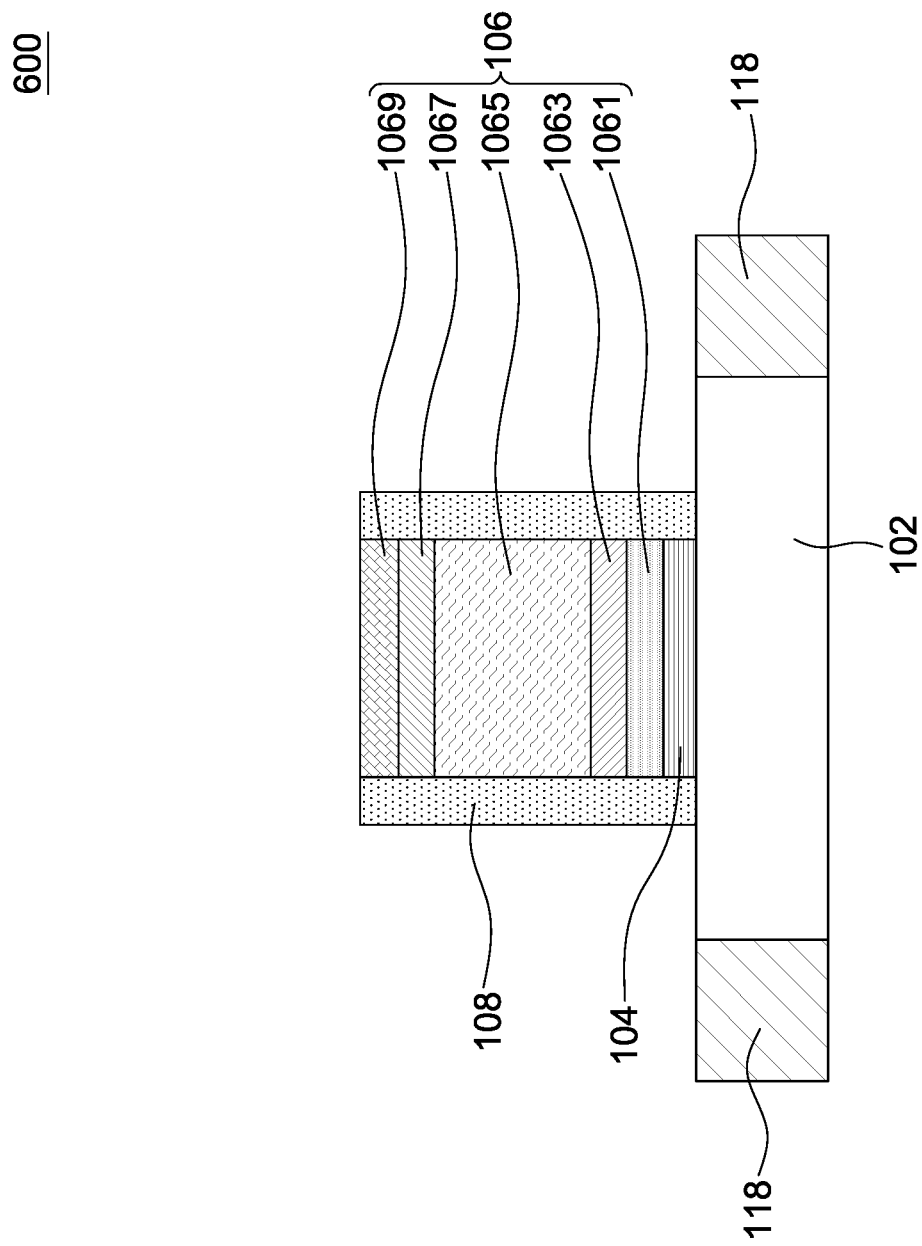

Referring to FIG. 6I, in some embodiments, an etching process may be performed on the spacer layer 108 to remove a portion of the spacer layer 108 so that a portion of the top surface of the substrate 102 and a portion of the top surface of the gate stack 106 may be exposed and sidewalls of the gate stack 106 and the blocking layer 104 may be covered by the spacer layer 108.

Figure 6J:
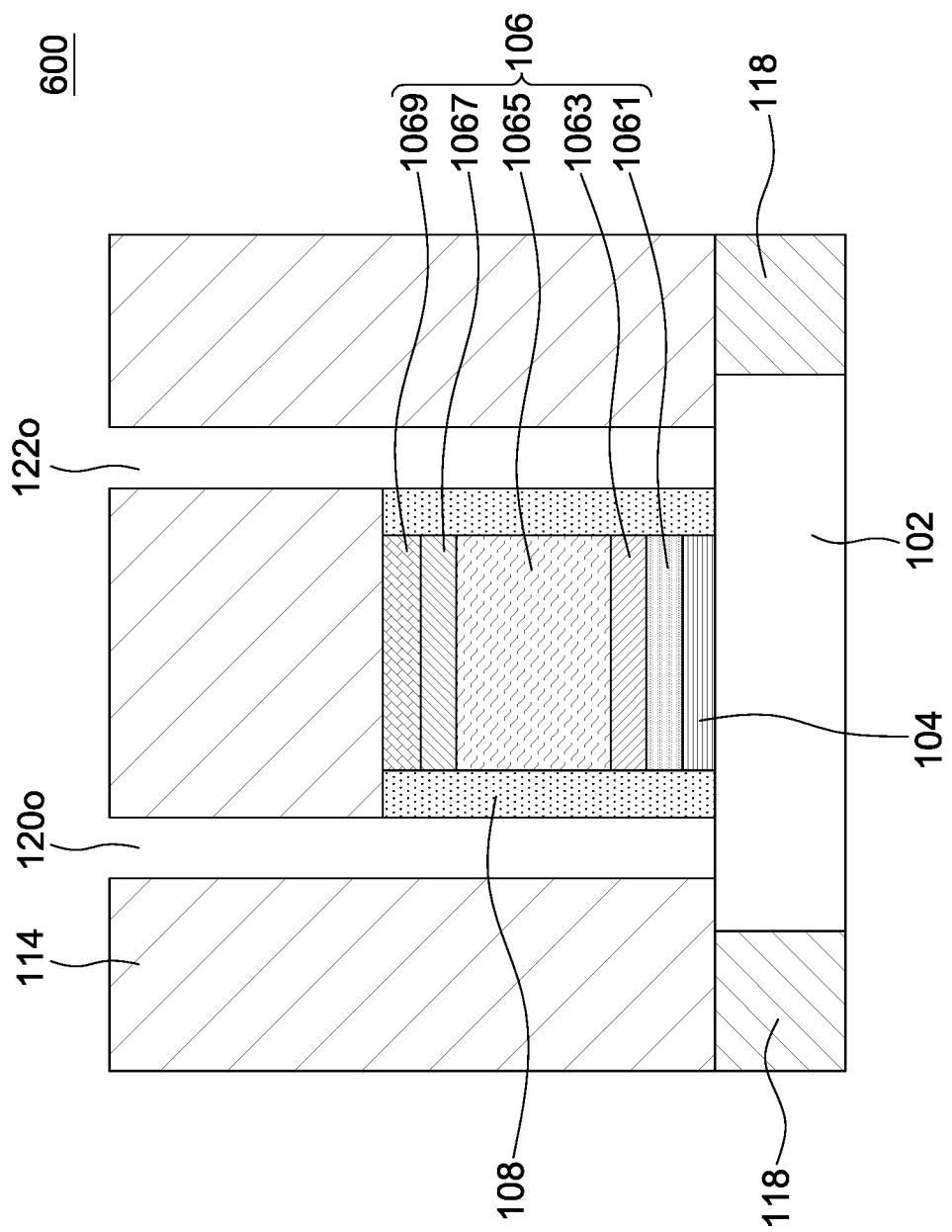

Referring to FIG. 6J, in some embodiments, the method 500 proceeds with operation 508, in which a patterned interlayer dielectric layer 114 may be formed over the substrate 102. In some embodiments, the interlayer dielectric layer 114 may be formed using CVD, PVD or ALD over the substrate 102 and the gate stack 106. In some embodiments, a photolithographic masking process may be performed to the interlayer dielectric layer 114 to define a source region contact pattern and a drain region contact pattern. In some embodiments, an etching process may be performed to the interlayer dielectric layer 114 to define a source region contact opening 120o and a drain region contact opening 122o, which expose portions of the top surface of the substrate 102. In some embodiments, the etching process may include a wet etching process and a dry etching process, or a combination thereof.

Figure 6K:
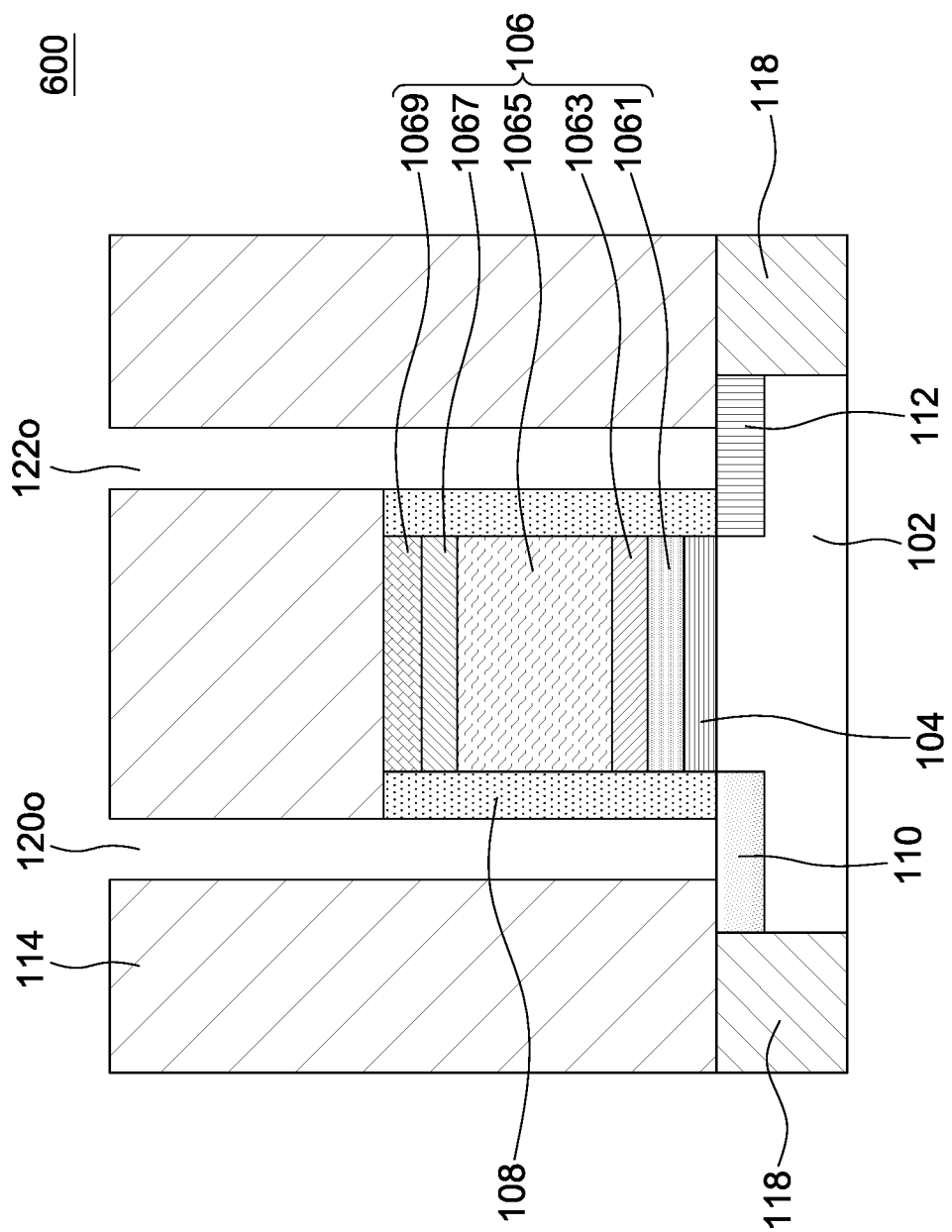

Referring to FIG. 6K, in some embodiments, the method 500 proceeds with operation 510, in which a source region 110 and a drain region 112 are formed within the substrate 102 through the patterned interlayer dielectric layer 114. In some embodiments, an implant process may be performed to the substrate 102 through the patterned interlayer dielectric layer 114 to form a source region 110 and a drain region 112 within the substrate 102. In some embodiments, during the implant process, plasma treatment of argon (Ar), hydrogen ($H_2$), nitrogen ($N_2$), helium (He) or a combination thereof may be performed to form high conductivity indium-rich (in-rich) regions in the source region 110 and the drain region 112, which may reduce contact resistance and may promote the formation of highly doped $n^+$ regions.

Figure 6L:
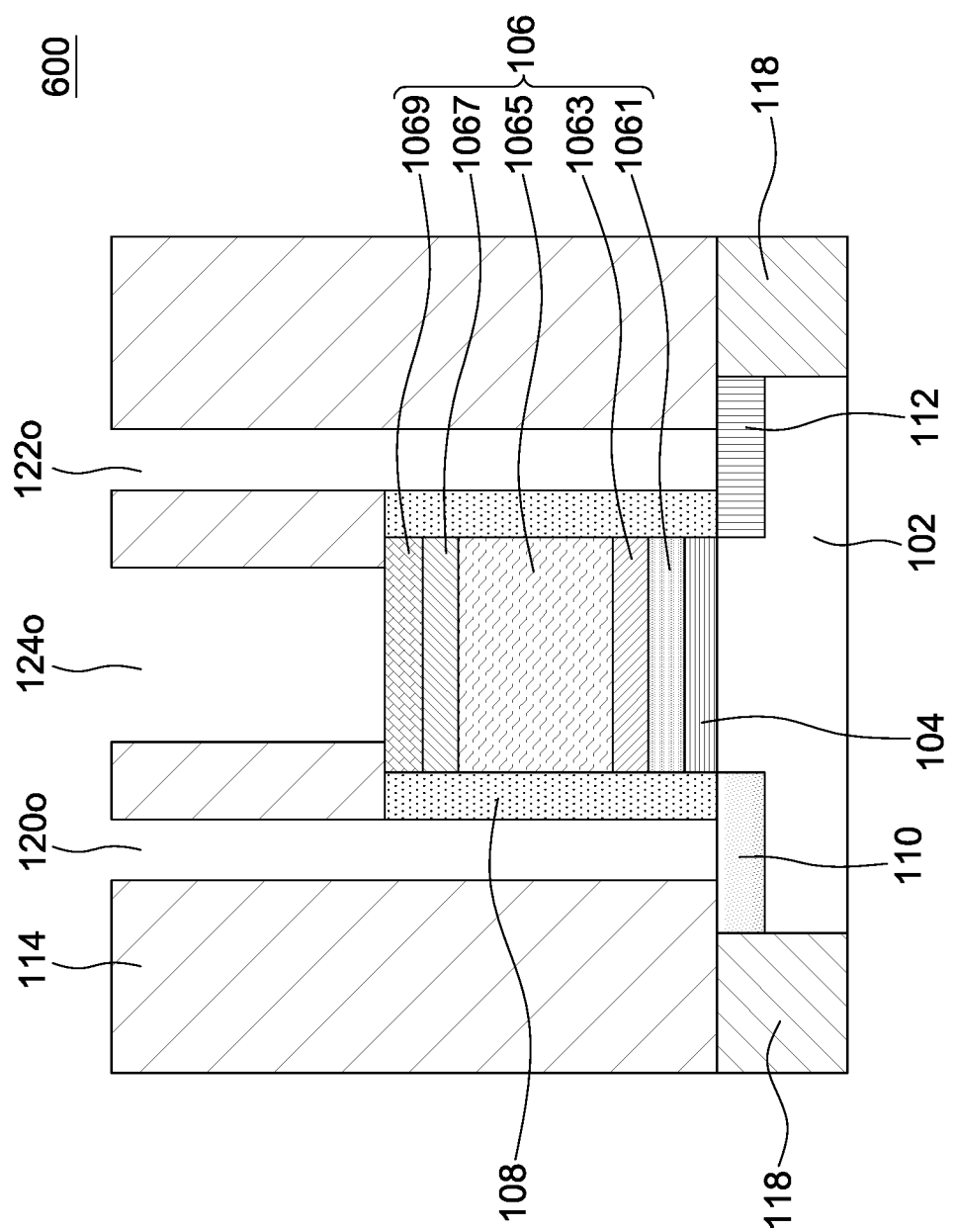

Referring to FIG. 6L, in some embodiments, after the source region 110 and the drain region 112 are defined, a photolithographic masking process may be performed to the interlayer dielectric layer 114 to define a gate region contact opening 124o. In some embodiments, an etching process may be performed to the interlayer dielectric layer 114 to define the gate region contact opening 124o, which exposes a portion of the top surface of the gate stack 106. In some embodiments, the etching process may include a wet etching process and a dry etching process, or a combination thereof.

Figure 6M:
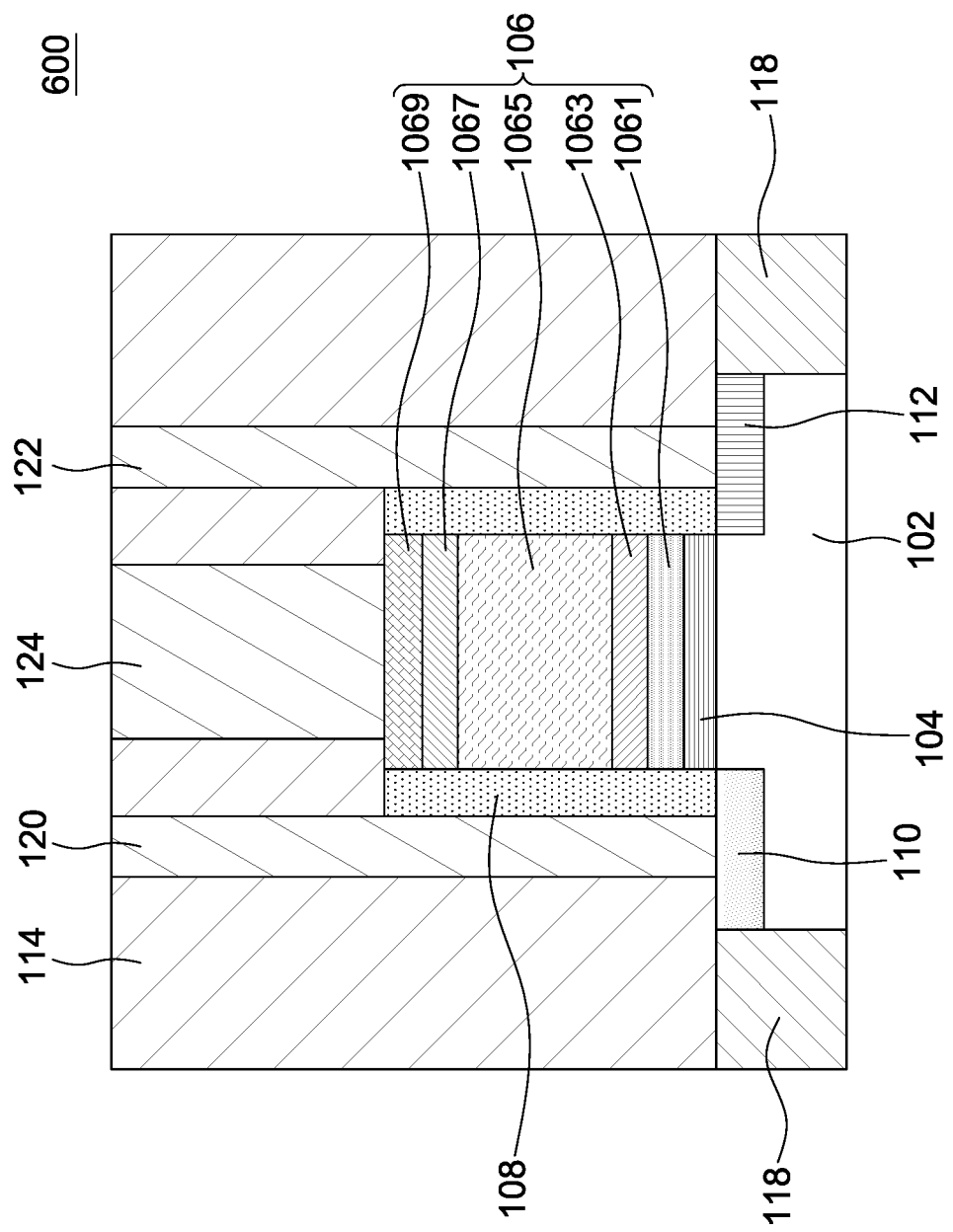
Figure 7A:
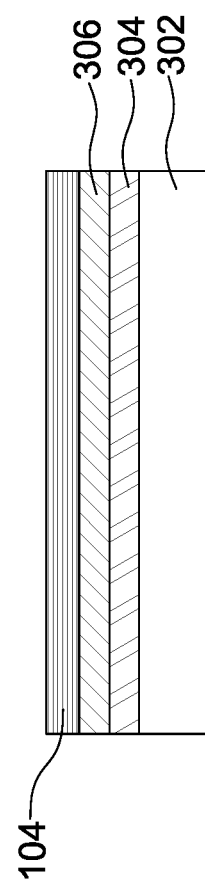
FIGS. 7A to 7M illustrate schematic cross-sectional views of a semiconductor structure at various stages of fabrication in accordance with some embodiments of the present disclosure.
Figure 7B:
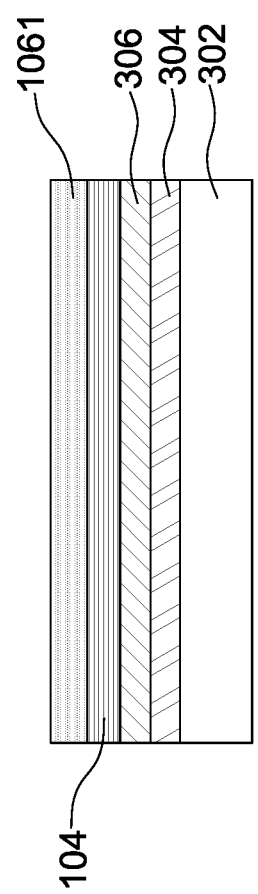
Figure 7C:
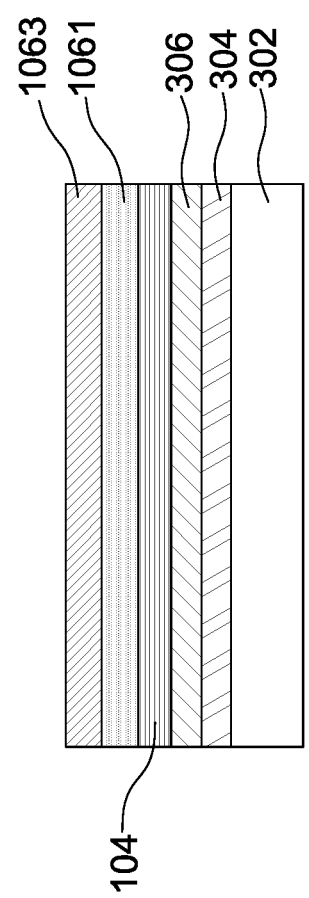
Figure 7D:
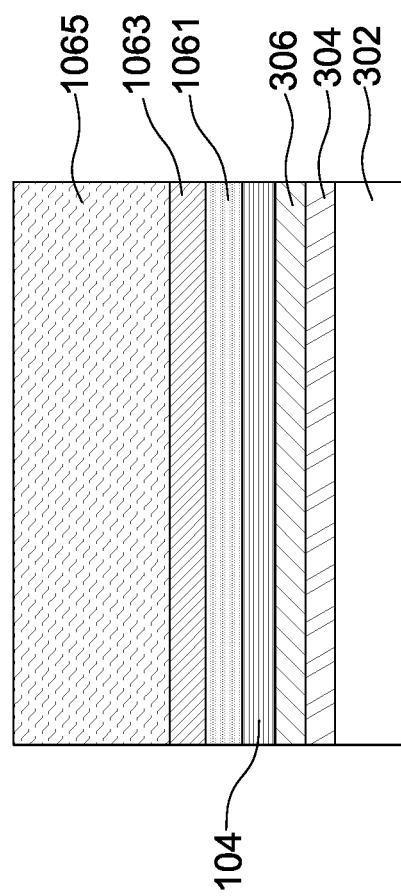
Figure 7E:
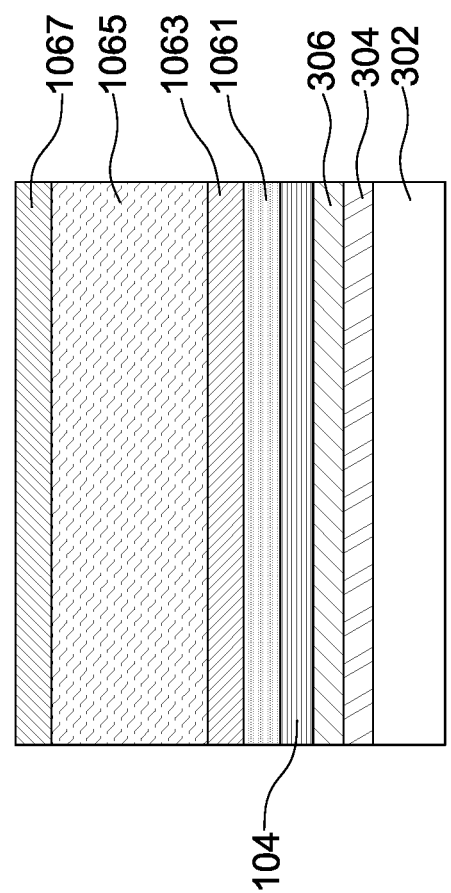
Figure 7F:
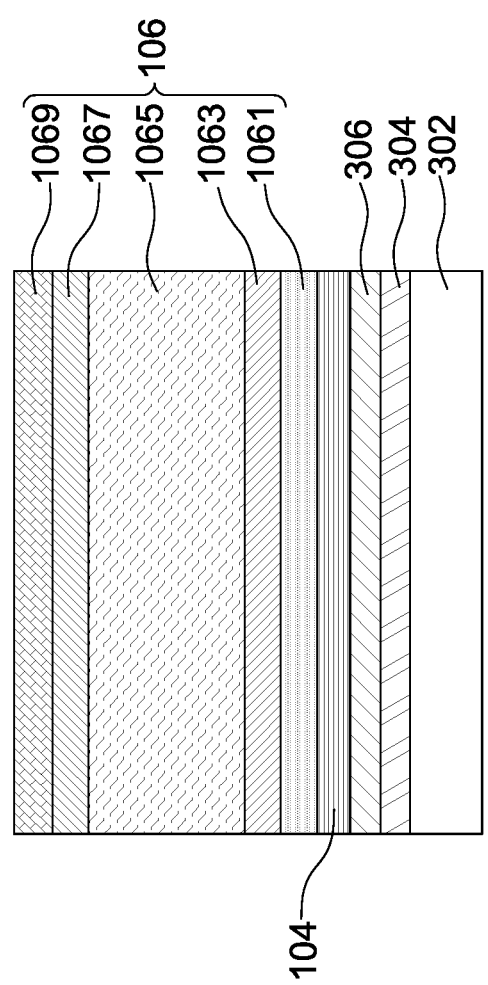
Figure 7G:
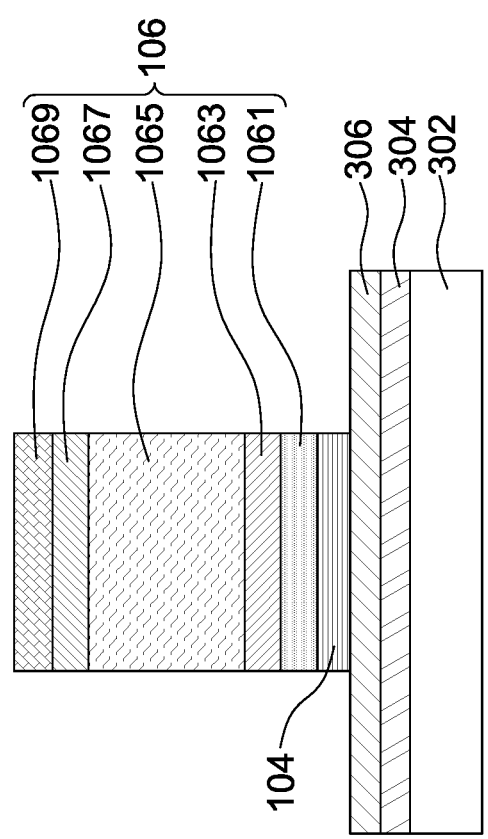
Figure 7H:
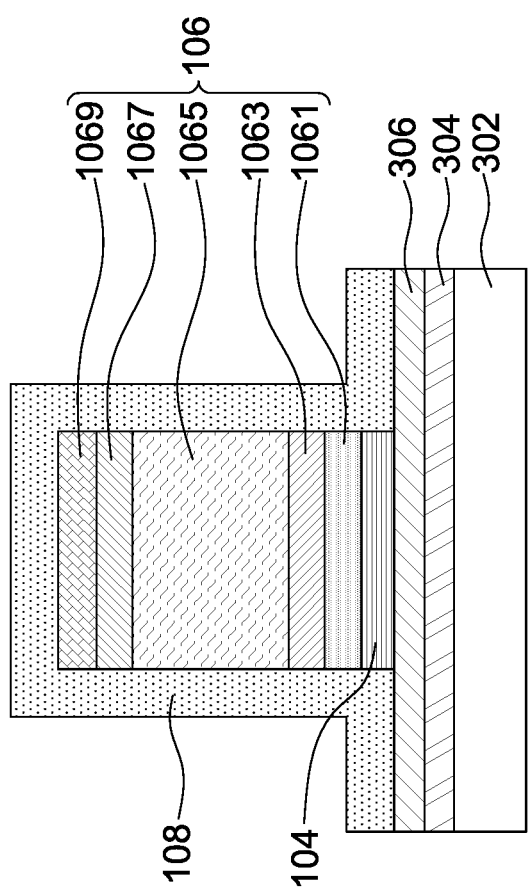
Figure 7I:
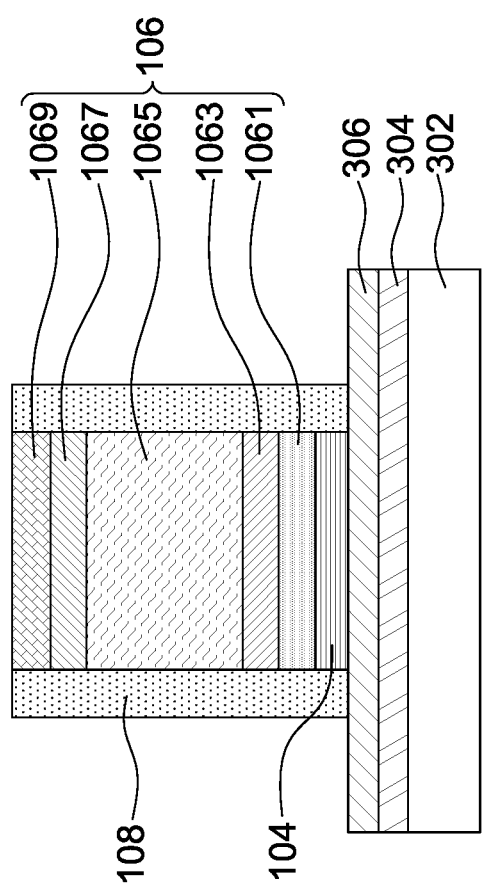
Figure 7J:
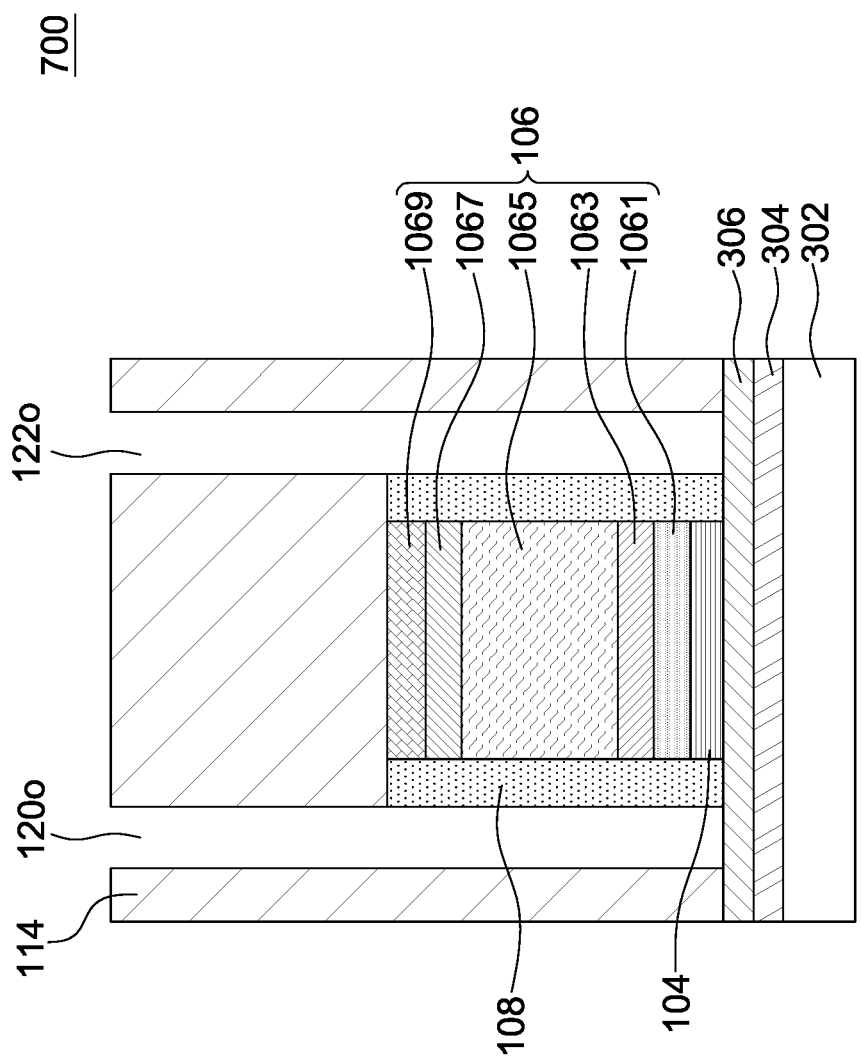
Figure 7K:
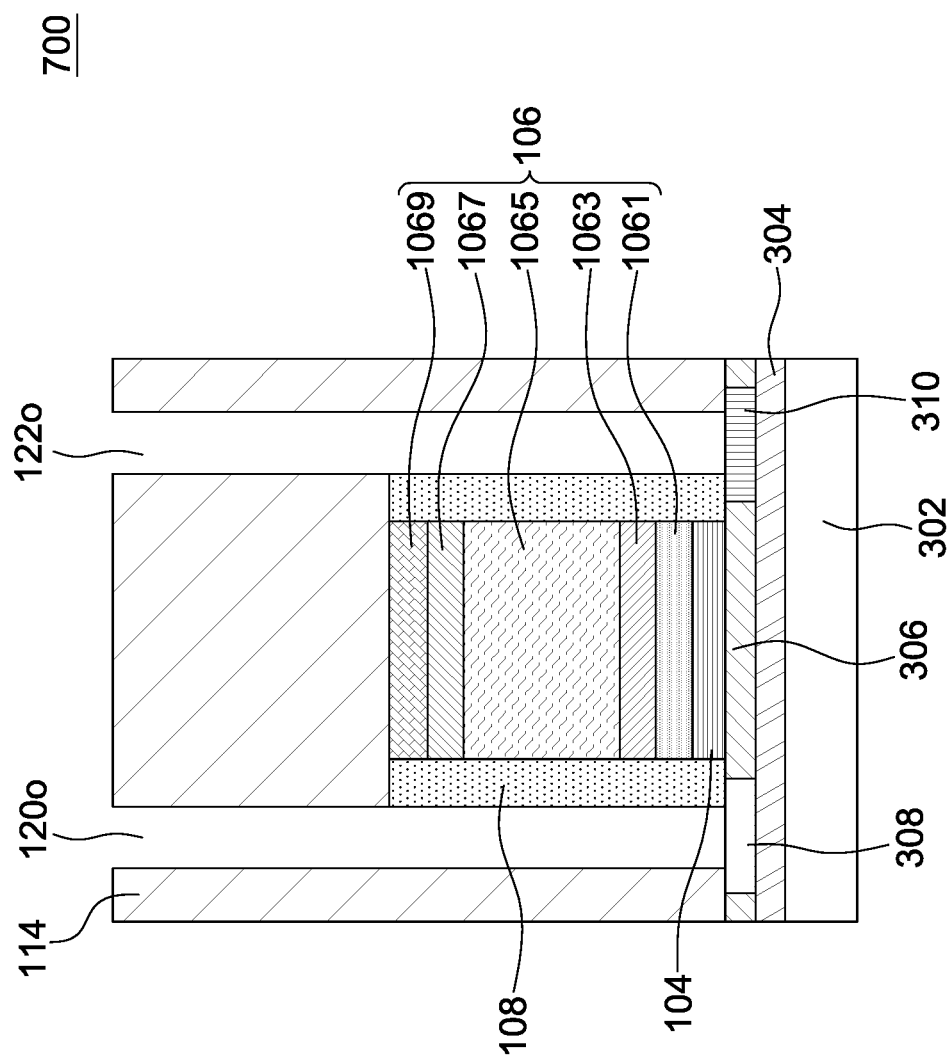
Figure 7L:
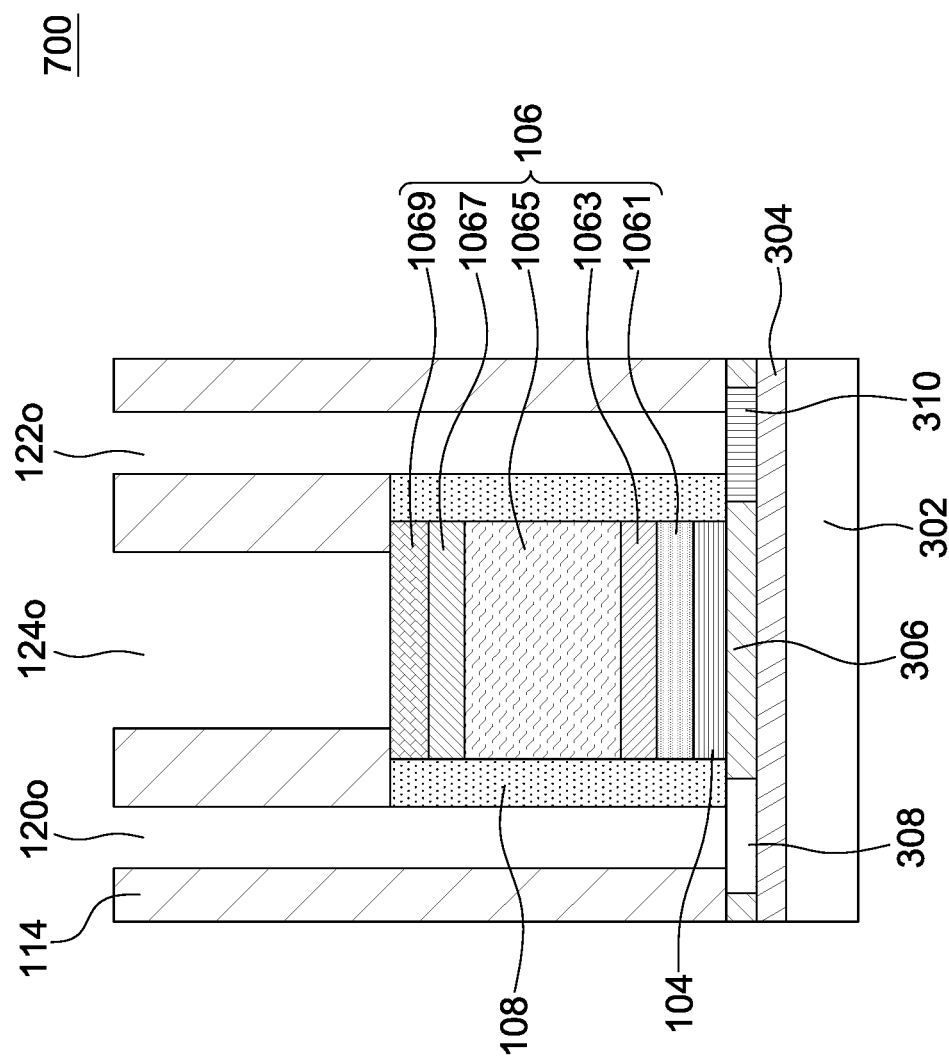
Figure 7M:
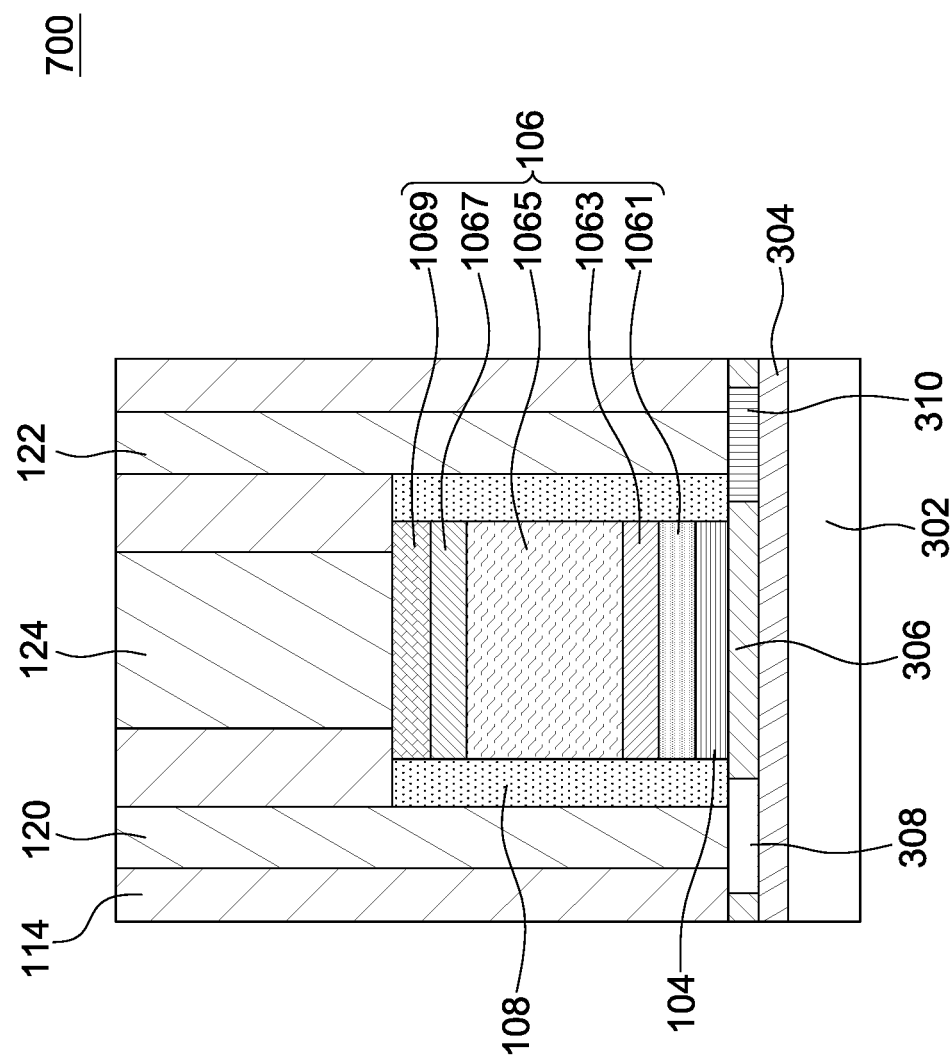

Referring to FIG. 6M, in some embodiments, a conductive material is filled within the source region contact opening 110o, the drain region contact opening 112o and the gate region contact opening 124o using CVD, PVD or ALD. A planarization operation such as a chemical-mechanical polishing (CMP) may be performed to remove superfluous materials. Accordingly, a source region contact 120, a drain region contact 122 and a gate region contact 124 are obtained, as shown in FIG. 6M.

In some embodiments, the lower conductive layer 1061 may be annealed prior to forming the first seed layer 1063. In some embodiments, the lower conductive layer 1061 may be annealed by a post metal annealing (PMA) process to enhance stress of the lower conductive layer 1061. In some embodiments, the PMA process may be performed at a temperature of from 400° C. to 900° C. In some embodiments, the PMA process may be performed in an ambient air of $N_2$, Ar, oxygen ($O_2$), or a combination thereof.

In some embodiments, the upper conductive layer 1069 may be annealed by a post metal annealing (PMA) process to enhance stress of the upper conductive layer 1069 and the crystallinity of the ferroelectric layer 1065. In some embodiments, the PMA process may be performed at a temperature of from 400° C. to 900° C. In some embodiments, the PMA process may be performed in an ambient air of $N_2$, Ar, oxygen ($O_2$), or a combination thereof.

In some embodiments, the first seed layer 1063 may be annealed prior to the formation of the ferroelectric layer 1065. In some embodiments, the first seed layer may be annealed by in-situ thermal annealing. In some embodiments, in-situ thermal annealing is performed at a temperature of from 400° C. to 700° C. In some embodiments, the in-situ annealing may be performed by substrate heating or an embedded IR heating kits around an apparatus, such as a chamber, in which the semiconductor structure 600 is located. In some embodiments, the in-situ annealing may be performed for a duration between approximately 1 minute and approximately 5 minutes. In some embodiments, crystallinity of the first seed layer 1063 may be improved by the in-situ annealing.

In some embodiments, the first seed layer 1063 may promote the remnant polarization (2Pr, wherein $2Pr=Pr^+-Pr^-$) and crystallinity of the ferroelectric layer 1065. In some embodiments, the upper electrode 1069 and the low electrode 1061 may be formed with tensile stress to stabilize the ferroelectric layer 1065. In some embodiments, the upper electrode 1069 and the low electrode 1061 may be formed with tensile stress to stabilize the ferroelectric layer 1065 of o-phase. In some embodiments, the blocking layer 104 may reduce electron or hole injection from the channel, which is induced when a gate voltage larger than the threshold voltage is applied to the semiconductor structure 600, to the gate stack 106, and thus may reduce the leakage current flow from the channel formed within the substrate 102 to the gate stack 106 and may enhance the endurance and retention of the semiconductor structure 600.

In some embodiments, a second blocking layer (not shown) may be formed after the formation of the first seed layer 1063. In some embodiments, the second blocking layer may be formed prior to the formation of the second seed layer 1067. In some embodiments, the second blocking layer may be formed after the formation of the first seed layer 1063. In some embodiments, the second blocking layer may be formed between the formation of the first seed layer 1063 and the formation of the second seed layer.

Refer to FIGS. 7A to 7M. FIGS. 7A to 7M illustrate schematic cross-sectional views of a semiconductor structure 700 at various stages of fabrication in accordance with some embodiments of the present disclosure. The semiconductor structure 700 may include a substrate 302 as described above and as shown in FIG. 3. In some embodiments, a buffer layer 304 may be formed over the substrate 302 by PVD, CVD, or ALD. In some embodiments, a channel layer 306 may be formed over the buffer layer 304 by PVD, CVD, or ALD. In some embodiments, the operations carried out in the semiconductor structure 700 as shown in FIGS. 7A to 7M starting from the formation of the blocking layer 104 may correspond to those described above with respect to FIGS. 6A to 6M.

Figure 8:
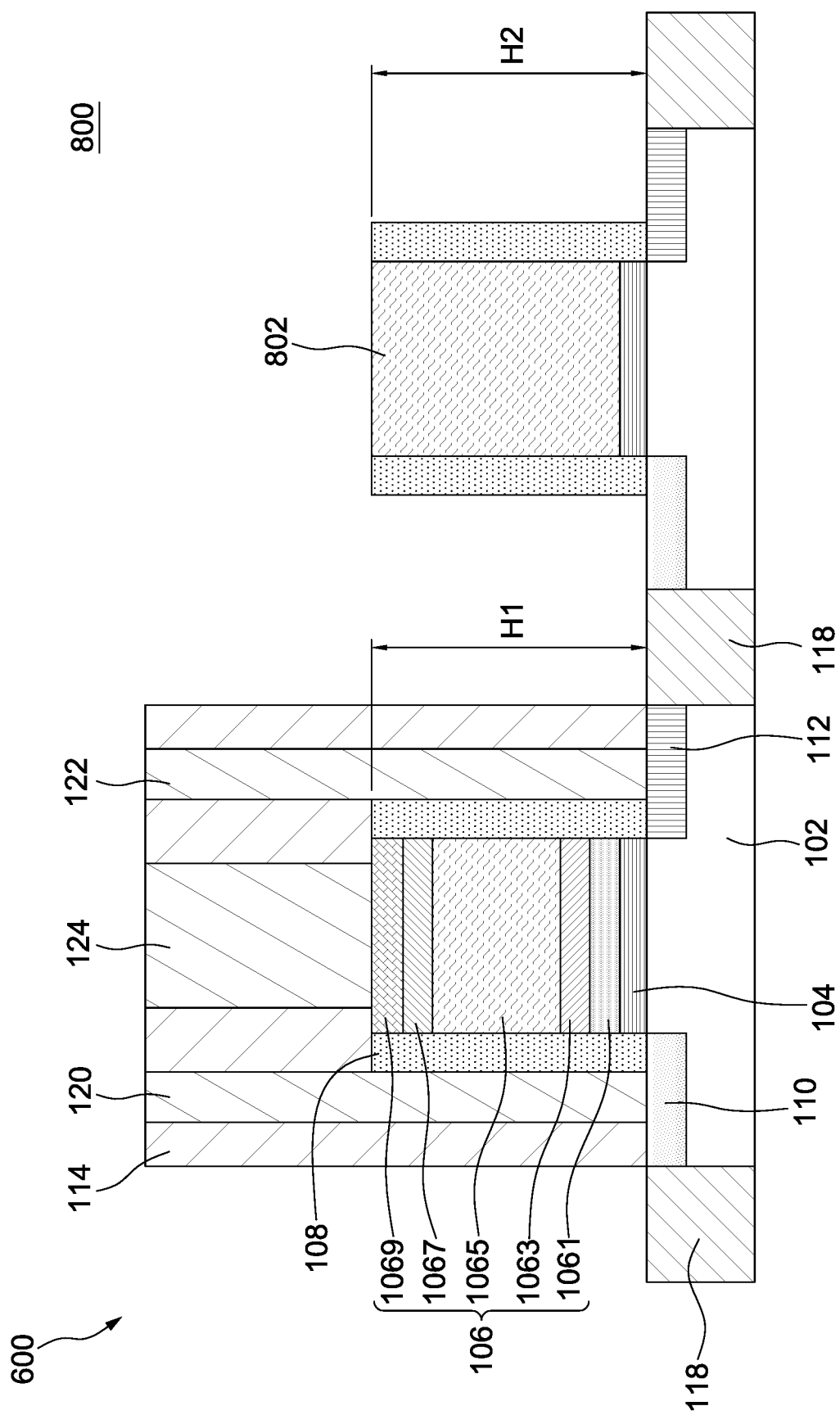
FIG. 8 illustrates a schematic cross-sectional view of a semiconductor structure as shown in FIG. 6L integrated with an FET device in accordance with some embodiments of the present disclosure.

Refer to FIG. 8. FIG. 8 illustrates a schematic cross-sectional view of an integrated semiconductor structure 800 including a semiconductor structure 600 integrated with a field effect transistor (FET). In some embodiments, the forming of semiconductor structure 600 may be integrated with CMOS manufacturing operations. In such embodiments, a sum height H1 of a thickness of the gate stack 106 and a thickness of the blocking layer 104 may be similar to a height H2 of a gate structure 802 of an FET device, but the disclosure is not limited thereto. In some embodiments, the semiconductor structure 600 and the FET device may be electrically separated from each other by the isolation structure 118.

Accordingly, the present disclosure therefore provides a semiconductor structure and a method for forming the same. In some embodiments, the semiconductor structure may be an MFMIS memory structure. In some embodiments, the semiconductor structure includes a top-gate structure. In some embodiments, the semiconductor structure may be a self-aligned top-gate coplanar MFMIS memory structure. In some embodiments, the MFMIS memory structure includes a doped hafnium zirconium oxide blocking layer that may be formed by ALD. Accordingly, the doped hafnium zirconium oxide blocking layer may be doped with Si or other materials so as to form a high bandgap compared to the bandgap of the channel region to reduce electron or hole injection from the channel region to the gate stack of the MFMIS memory structure so as to reduce electro/hole current leakage, the negative-bias temperature instability (NBTI), the positive-bias temperature instability (PBTI) due to lower oxygen vacancies, and may enhance the endurance and retention of the MFMIS memory structure. In addition, the current leakage may be reduced with higher conduction band offset between channel and gate dielectric ($V_{CBO}$), and higher valence band offset between channel and gate dielectric ($V_{VBO}$).

Moreover, the MFMIS memory structure includes a seed layer between the lower electrode and the ferroelectric layer, which may promote the remnant polarization of the ferroelectric layer. Furthermore, the crystallinity of the seed layer may be increased by annealing. Nonetheless, the electrodes with tensile stress may stabilizes the o-phase ferroelectric layer, such as the o-phase $Hf_xZr_{1-x}O_2$ ferroelectric layer. None the less, the upper electrode and/or lower electrode are annealed, which may lead to the enhancement of the tensile stress of the upper electrode and/or lower electrode and the increase of the crystallinity of the ferroelectric layer disposed between the upper electrode and the lower electrode.

In some embodiments, a semiconductor structure is provided. The semiconductor structure includes a gate stack over the substrate and a blocking layer disposed between the gate stack and the substrate. The gate structure includes an upper electrode, a lower electrode, a ferroelectric layer disposed between the upper electrode and the lower electrode, and a first seed layer disposed between the ferroelectric layer and the lower electrode. The blocking layer includes doped hafnium oxide.

In some embodiments, a semiconductor structure is provided. The semiconductor structure includes a gate stack over a substrate, a channel layer disposed between the gate stack and the substrate, a blocking layer disposed between the gate stack and the channel layer, a source region and a drain region. The gate stack includes an upper annealed electrode, a lower annealed electrode, a ferroelectric layer disposed between the upper annealed electrode and the lower annealed electrode, and a first seed layer disposed between the ferroelectric layer and the lower annealed electrode. The blocking layer includes doped hafnium oxide.

In some embodiments, a method for forming a semiconductor structure is provided. The method includes following operations. A layer stack is formed over the substrate. The formation of the layer stack includes the following sub-operations: a blocking layer is formed over the substrate, a lower conductive layer is formed over the blocking layer, a first seed layer is formed over the lower conductive layer, a ferroelectric layer is formed over the first seed layer, and an upper conductive layer is formed over the ferroelectric layer. The layer stack is patterned to form a gate stack over the substrate. A spacer layer is formed over sidewalls of the gate stack. A pattered interlayer dielectric layer is formed over the substrate and the gate stack. A source region and a drain region are formed in the substrate through the patterned interlayer dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a gate stack over a substrate, wherein the gate stack includes:
        an upper electrode;
        a lower electrode;
        a ferroelectric layer disposed between the upper electrode and the lower electrode;
        a first seed layer disposed between the ferroelectric layer and the lower electrode;
        a second seed layer disposed between the ferroelectric layer and the upper electrode; and
        a first blocking layer disposed between the first seed layer and the second seed layer; and
    a second blocking layer disposed between the gate stack and the substrate, wherein the second blocking layer comprises doped hafnium oxide.

2. The semiconductor structure of claim 1, wherein the doped hafnium oxide comprises Si, Mg, Al, Y2O3, La, Sr, Gd, N, Sc, Ca or a combination thereof.

3. The semiconductor structure of claim 2, wherein the doped hafnium oxide comprises Si.

4. The semiconductor structure of claim 3, wherein the doped hafnium oxide comprises Si in a proportion of from 1% to 90%.

5. The semiconductor structure of claim 1, wherein the first blocking layer comprises a doped tantalum oxide, a hafnium oxide, or a combination thereof.

6. The semiconductor structure of claim 1, wherein the first blocking layer is disposed between the first seed layer and the ferroelectric layer.

7. The semiconductor structure of claim 1, wherein the first blocking layer is disposed between the ferroelectric layer and the second seed layer.

8. A semiconductor structure, comprising:
    a gate stack over a substrate, wherein the gate stack includes:
        an upper annealed electrode;
        a lower annealed electrode;
        a ferroelectric layer disposed between the upper annealed electrode and the lower annealed electrode;
        a first seed layer disposed between the ferroelectric layer and the lower annealed electrode;
        a second seed layer disposed between the ferroelectric layer and the upper annealed electrode; and
        a first blocking layer disposed between the first seed layer and the second seed layer;
    a channel layer disposed between the gate stack and the substrate;
    a second blocking layer disposed between the gate stack and the channel layer, wherein the second blocking layer comprises doped hafnium oxide, and
    a source region and a drain region within the channel layer.

9. The semiconductor structure of claim 8, wherein the doped hafnium oxide comprises Si, Mg, Al, Y2O3, La, Sr, Gd, N, Sc, Ca or a combination thereof.

10. The semiconductor structure of claim 9, wherein the doped hafnium oxide comprises Si.

11. The semiconductor structure of claim 10, wherein the doped hafnium oxide comprises Si in a proportion of from 10% to 50%.

12. The semiconductor structure of claim 8, wherein the first blocking layer comprises a doped tantalum oxide, a hafnium oxide, or a combination thereof.

13. The semiconductor structure of claim 8, wherein the first blocking layer is disposed between the first seed layer and the ferroelectric layer.

14. The semiconductor structure of claim 8, wherein the first blocking layer is disposed between the ferroelectric layer and the second seed layer.

15. A semiconductor structure, comprising:
    a gate stack over a substrate, wherein the gate stack includes:
        an upper electrode;
        a lower electrode;
        a ferroelectric layer disposed between the upper electrode and the lower electrode;
        a first seed layer disposed between the ferroelectric layer and the lower electrode;
        a second seed layer disposed between the ferroelectric layer and the upper electrode; and
        a first blocking layer disposed between the first seed layer and the second seed layer;
    a second blocking layer disposed between the gate stack and the substrate, wherein the second blocking layer comprises doped hafnium oxide, and
    a source region and a drain region formed within the substrate.

16. The semiconductor structure of claim 15, wherein the doped hafnium oxide comprises Si.

17. The semiconductor structure of claim 16, wherein the doped hafnium oxide comprises Si in a proportion of from 10% to 50%.

18. The semiconductor structure of claim 15, wherein the first blocking layer comprises a doped tantalum oxide, a hafnium oxide, or a combination thereof.

19. The semiconductor structure of claim 15, wherein the first blocking layer is disposed between the first seed layer and the ferroelectric layer.

20. The semiconductor structure of claim 15, wherein the first blocking layer is disposed between the ferroelectric layer and the second seed layer.

* * * * *